United States Patent [19]
Iwasaki

[11] Patent Number: 6,034,712
[45] Date of Patent: Mar. 7, 2000

[54] EXPOSURE APPARATUS AND IMAGE FORMING MACHINE INCLUDING IT

[75] Inventor: Takeo Iwasaki, Nagoya, Japan

[73] Assignee: Brother Kogyo Kabushiki Kaisha, Nagoya, Japan

[21] Appl. No.: 08/881,155

[22] Filed: Jun. 24, 1997

[30] Foreign Application Priority Data

| Jun. 26, 1996 | [JP] | Japan | 8-165621 |
| Jul. 25, 1996 | [JP] | Japan | 8-195984 |
| Dec. 16, 1996 | [JP] | Japan | 8-335701 |

[51] Int. Cl.[7] ............................. B41J 2/447
[52] U.S. Cl. ............................. 347/241; 397/130
[58] Field of Search .................. 347/241, 245, 347/263, 238, 130, 242

[56] References Cited

U.S. PATENT DOCUMENTS

| 3,072,481 | 1/1963 | Berman et al. | 347/241 |
| 4,378,149 | 3/1983 | Ebner | 355/27 |
| 4,399,209 | 8/1983 | Sanders et al. | 399/207 |
| 4,440,846 | 4/1984 | Sanders et al. | 347/238 |
| 4,648,699 | 3/1987 | Holycross | 355/100 |
| 4,740,809 | 4/1988 | Yamamoto et al. | 355/400 |
| 4,928,122 | 5/1990 | Doi et al. | 430/211 |
| 4,992,822 | 2/1991 | Yamamoto et al. | 430/211 |
| 5,550,627 | 8/1996 | Dowler et al. | 355/402 |
| 5,617,131 | 4/1997 | Murano et al. | 347/241 |
| 5,642,149 | 6/1997 | Palum | 347/241 |
| 5,812,892 | 9/1998 | Miyoshi et al. | 347/241 |

FOREIGN PATENT DOCUMENTS

| 62-161153 | 7/1987 | Japan |
| 62-231758 | 10/1987 | Japan |
| 63-31364 | 2/1988 | Japan |
| 4-369633 | 12/1992 | Japan |

*Primary Examiner*—N. Le
*Assistant Examiner*—Lamson D. Nguyen
*Attorney, Agent, or Firm*—Oliff & Berridge, PLC

[57] ABSTRACT

An image forming machine includes an exposure unit and a pressure development unit for forming an image on a microcapsule coated sheet. The exposure unit includes a plurality of light emitting elements, a substrate having reflective recesses formed in the surface thereof, the plurality of light emitting elements being disposed in the recesses, and a mask having openings formed opposite the plurality of light emitting elements. The reflective recess prevents light from the light emitting element from exiting through the pinhole other than the pinhole opposed to that light emitting element, thus improving the efficiency of utilization of exposure light. A partition may be provided between the light emitting elements.

52 Claims, 19 Drawing Sheets

EXPOSURE APPARATUS AND IMAGE FORMING MACHINE INCLUDING IT

BACKGROUND OF THE INVENTION

1. Field of the Invention

The present invention relates to an image forming machine for exposing a photosensitive recording medium to an image-forming light corresponding to image information to form a latent image of the image information on the surface of the photosensitive recording medium, and developing it to convert the latent image to a visible image. More particularly, the invention concerns an exposure apparatus which projects image-forming light for exposure using a plurality of light emitting elements and an image forming machine including the exposure apparatus.

2. Description of the Related Art

U.S. Pat. Nos. 4,440,846 and 4,399,209 disclose imaging systems in which a photosensitive layer having microcapsules containing a photosensitive substance as an internal phase is exposed image-wise to radiation, and subjected to a uniform rupturing force, whereby the microcapsules are ruptured to release the internal phase substance image-wise. According to these systems, the mechanical strength of the microcapsules is varied by exposure to form an exposed latent image. Under pressure, the capsules with a low mechanical strength (the capsules that have not been radiation cured, or the capsules that have been radiation softened) are destroyed to drain the inclusions such as coloring materials, which effects development.

These imaging systems are completely dry systems, and are markedly advantageous, because they do not rely on a wet developing solution to produce an image. An image forming coupler, such as a nearly colorless chromogenic material, is normally encapsulated in microcapsules. Once the microcapsules are ruptured, the chromogenic material (coupler) as a coloring material reacts with a developer material to form a colored image.

In the embodiments described in the quoted patents, microcapsules are normally ruptured by passing an image-wise exposed microcapsule coated sheet through the nip between a pair of cylindrical calender (polishing) rollers. Usually, high pressure, large polishing rollers are used to develop a microcapsule coated sheet. Even metallic polishing rollers with considerable precision are not smooth on the surface. When one of the rollers simply rests on the other roller, the surfaces of both rollers do not make contact over the entire width of the rollers. By applying a pressure to the rollers, their unsmooth surfaces o r the irregularities of their surfaces are smoothed, providing a uniform contact line between the two rollers. To achieve distribution of a microcapsule-destroying force throughout the surface of the microcapsule coated sheet, high pressure and large rollers are required. Unless the force is distributed evenly, the microcapsule coated sheet will not be developed uniformly, and the tone characteristics of the created image will be poor. As an example of developing system for resolving this disadvantage, Japanese Laid-Open Patent Publication No. 161153/87 discloses a point contact developing ball.

Known image forming machines for exposing such a photosensitive recording medium to image-forming light corresponding to image information, followed by developing it, include the image forming machine disclosed in Japanese Laid-Open Patent Publication No. 231758/87 corresponding to U.S. Pat. No. 4,740,809 which guides light from a white light source selectively to a photosensitive recording medium according to a print pattern; the system of Japanese Laid-Open Patent Publication No. 31364/88 corresponding to U.S. Pat. No. 4,740,809 which scans light from light sources of a plurality of colors and guides it to a photosensitive recording medium; the system of Japanese Laid-Open Patent Publication No. 369633/92 which guides light from a white light source selectively to a photosensitive recording medium through liquid crystal shutters having optical filters for a plurality of colors; and the system of U.S. Pat. No. 4,992,822 which exposes the same site in a photosensitive recording medium, capable of showing a plurality of colors, through a polygonal mirror a plurality of times.

U.S. Pat. No. 5,550,627 discloses an exposure and pressure applicator device for use in printing an image onto imaging media, containing photosensitive microcapsules. The device has an exposure means adjacent to the imaging media comprising at least one exposure-producing element which image-wise exposes the imaging media providing a latent image thereon; a pressure applicator means containing at least one point contact element to apply a uniform rupturing force to the exposed imaging media; and motive means for effectuating synchronous movement of both exposure means and pressure applicator means relative to the imaging media.

Among photosensitive recording media using no microcapsules are highly sensitive silver salt photographic media in which the necessary energy per unit area for exposure is less than about a hundredth of that required for photosensitive recording media using microcapsules. Known color image forming machines for exposing silver salt photographic media to image-forming light in accordance with color image information include image forming machines using color liquid crystal shutters, image forming machines using color CRT's, and image forming machines using color laser scan systems, as in the case of technologies for photosensitive recording media using microcapsules.

In recent years, there have been devised image forming machines using a plurality of light emitting elements to expose a photosensitive recording medium to image-forming light. With this type of image forming machine, a plurality of light emitting elements are fixed to an exposure head to be moved relatively along a photosensitive recording medium, and output light from the light emitting elements is selectively projected to the photosensitive recording medium. In detail, light is projected from the light emitting elements in all directions, so that only specified beams of the light (those beams perpendicular to the photosensitive recording medium) are used for exposure. To select such specified beams of light, a shield plate (mask) is provided which has pinholes formed opposite the light emitting elements.

With this type of image forming machine, however, only part of the total power of the output light from the light emitting elements is conveyed to the photosensitive recording medium through the shield plate in comparison with the energy per unit area necessary for the photosensitive recording medium. That is, only part of the energy can be used, making the efficiency of light utilization poor. Because of low sensitivity, the achievement of adequate exposure has taken time. For example, with respect to the total power of light from an LED (light emitting element), the rate of outgoing light through the corresponding pinhole (opening) is as low as about 10%. Most of the remaining light mingles with the equivalents in the path between the other LED's and the corresponding pinholes, and goes out through that pinhole as unnecessary background light which does not correspond to the image. As a result, deteriorations in image quality occur, such as worsened color reproduction of the image, poor lightness reproduction, and apparent decrease in resolution. In short, before output light from one LED appears through the corresponding pinhole, output light from other LED's mixes with it, with the result that untoward light exits through that pinhole, deteriorating the quality of the resulting image.

Furthermore, output light from the light emitting element is emitted in all directions on the surface of its mounting. If the light emitting elements are adjacent to each other, therefore, the problem arises that stray light from the adjacent light emitting element develops, exposing the photosensitive recording medium. Assume, for instance, that the pinhole, a, of the shield plate is opposed to the light emitting element, A, and the pinhole, b, of the shield plate is opposed to the light emitting element, B. Here, the stray light implicates that not only the output light from the light emitting element A passes through the pinhole a, but the output light from the light emitting element B also passes through the pinhole a after being reflected from the surface of the light emitting element A, the electrical connection, wiring, and so on. This means that if the stray light occurs when the light emitting element A is not on, there will be an exposed latent image formed when the light emitting element A has been lit.

Also imagine that the photosensitive recording medium is sensitive to light in a plurality of wavelength ranges, and that the light emitting element A emits light of the first wavelength, while the light emitting element B emits light of the second wavelength. In this case, should stray light develop, that part of the photosensitive recording medium which is opposite to the pinhole a may be exposed not only to light of the first wavelength, but to light of the second wavelength. This will make it difficult to form an exact exposed latent image. This is another problem that an unnecessary site is exposed to unintended light, debasing the quality of the image formed by the image forming machine.

The present invention has been aimed at solving the various problems with the conventional technologies. The object of the invention is to provide an exposure apparatus capable of increasing the efficiency of utilization of output light from light emitting elements, preventing the occurrence of stray light between a plurality of light emitting elements, and improving the quality of the resulting image; and an image forming machine including the exposure apparatus.

SUMMARY OF THE INVENTION

The present invention has been accomplished to eliminate the drawbacks of the customary technologies. A first object of the invention is to provide an exposure apparatus which can prevent light emitted by a plurality of light emitting elements from becoming stray light and can project exposure light of a predetermined wavelength onto positions corresponding to image data.

A second object of the invention is to provide an image forming machine which can prevent light emitted by a plurality of light emitting elements from becoming stray light and can thereby improve the quality of an output image.

A third object of the invention is to provide an image forming machine which can improve the quality of an output image by preventing light emitted by a plurality of light emitting elements from becoming stray light, and which is low in price and small in size.

According to a first aspect of the present invention, there is provided an exposure apparatus for exposing a photosensitive medium, comprising:

a plurality of light emitting elements;
a substrate having recesses formed in the surface thereof, the plurality of light emitting elements being disposed in the recesses; and
a mask having openings formed opposite the plurality of light emitting elements; wherein
the photosensitive medium is exposed to light emitted through the openings.

The exposure apparatus of the present invention arranges the plurality of light emitting elements in the recesses formed in the substrate. Thus, light emitted by each light emitting element is reflected or absorbed by the wall of the recess, and is so inhibited from heading toward the mask opening opposed to the adjacent light emitting element. As a result, stray light is prevented. Hence, light from each light emitting element can be collected through the opening of the mask opposed to the relevant light emitting element. The present invention can also impart reflecting properties, particularly, to the surface of the recess. Thus, part of light radiated from the light emitting element is reflected by the reflecting surface of the recess and ejected through the opening opposed to that light emitting element, so that the efficiency of optical utilization can be increased. To increase the optical utilization efficiency further, it is preferred that at least the surface of the recess of the substrate has reflecting properties, and the recess has such a shape that reflected light from the recess can be ejected through the opening provided opposite the relevant light emitting element.

In the exposure apparatus of the present invention, the openings may be pinholes. Since light from the light emitting element is projected onto the photosensitive medium through the pinhole of the mask, a small and thin exposure apparatus can be constructed. Alternatively, an optical element such as lens may be provided in or above the opening. Light that has passed through the optical element forms on the photosensitive medium a beam spot having a shape and dimensions depending on the optical characteristics of the optical element. In this case, the optical utilization efficiency can be increased compared with the pinhole, by making the opening larger than the pinhole and increasing the light receiving area of the lens, or by using a lens with a large numerical aperture (NA).

In the exposure apparatus of the present invention, a separating wall for preventing light from one light emitting element from exiting through an opening opposed to another light emitting element can be provided between the light emitting elements. The provision of the separating wall prevents stray light even more effectively, and enables exposure light of a desired wavelength to be emitted reliably through a particular opening of the mask. In this case, the mask can be supported above the substrate via the separating wall. This construction makes the structure of the exposure apparatus even simpler.

The photosensitive medium for use in the exposure apparatus of the present invention may be a medium which bears microcapsules enveloping a component varying in strength upon exposure, and a coloring material, and in which development is performed by draining the coloring material when the microcapsules are ruptured under pressure. As the coloring material of the photosensitive medium, a colored dye or pigment can be used. The pigment or dye that has drained from the pressure ruptured microcapsules can form a visible image. In this case, a sheet which receives, as image, the pigment or dye at the time of pressing is superimposed on the photosensitive medium, and the image receiving sheet is stripped after application of pressure. The image receiving sheet may be separate from the photosensitive medium before exposure, or may be strippably laminated on the photosensitive medium from the beginning. Alternatively, a colorless dye precursor may be used as the coloring material, and the dye precursor draining from the pressure ruptured capsules may be transferred to the image receiving sheet coated with a developer, thereby causing a color development reaction. In this case as well, the image receiving sheet bearing a developer can be laid on the photosensitive medium at the time of pressing, and the image receiving sheet can be peeled after pressing.

In addition to the above photosensitive medium relying on the principle of image transfer type development, a photosensitive medium using the principle of autocoupling or spontaneous coloration type development is usable. This type of medium comprises capsules enveloping a colorless dye precursor as a coloring material and a component varying in strength upon lighting (a photocuring or photosoftening component); and a developer which develops color upon reaction with the dye precursor; the capsules and the developer being borne on a substrate; and preferably includes a protective layer formed on the capsules and the developer. With this type of medium, an exposed latent image (a latent image based on changes in the strength of the capsules) is pressed to destroy the capsules with a low mechanical strength, whereafter the dye precursor enveloped therein reacts with the developer to generate a color.

In the exposure apparatus of the present invention, the light emitting elements may be LED'S, and the LED's may be connected to areas other than the recesses on the substrate by at least one electrical connection. Each LED is placed in the recess, and is electrically driven by having its electrical terminal connected to an area other than the recess on the substrate. At this time, the LED is placed in the recess, so that the altitudinal difference between the top surface of the LED and the substrate surface is decreased. Since an electrical wiring is installed with such a decreased altitudinal difference, the length of the wiring can be shortened.

The plurality of light emitting elements may be light emitting elements which emit light of different wavelengths from those of one another. As a result, a color image of a plurality of colors can be formed. The plurality of light emitting elements may include, for example, three light emitting elements which emit lights with central wavelengths for red, green and blue. Consequently, color information on a plain picture, the image information, is divided into red, green and blue pieces of information. According to these pieces of color information, the light emitting elements for the respective colors are driven to reproduce image information. Furthermore, it becomes possible to provide an image forming machine capable of using as a photosensitive recording medium a color photosensitive recording medium which is directly exposed image-wise to a plain picture by an image forming optical system such as lens.

In the exposure apparatus of the present invention, that surface of the mask which is opposed to the substrate can be subjected to reflection-free treatment. Thus, light not passing through the openings of the mask can be absorbed, and this is useful for the prevention of stray light.

In the exposure apparatus of the present invention, the substrate and the mask may be molded integrally. This can decrease the production cost.

According to a second aspect of the invention, there is provided an exposure apparatus for exposing a photosensitive medium, comprising:

a plurality of light emitting elements; and a substrate having recesses which are formed in the surface thereof and in which said plurality of the light emitting elements being accomodated;

an opening of each of the recesses being restricted as to function as a stop for a light beam from each of the light emitting elements.

In the second aspect of the invention, the openings of the recesses can function as the stops for the light beams from the light emmiting elements. Namely, the openings of the recesses have the same function as the openings of the mask of the exposure apparatus according to the first aspect of the invention. The light beam from each of the light emitting elements can be restricted by the stop and is directed to a portion, which is opposed to the each of the light emitting elements, of the surface of the photosensitive medium.

According to a third aspect of the present invention, there is provided an image forming machine for a photosensitive recording medium on whose surface a latent image of image information is formed by exposure and converted into a visible image by development, the image forming machine comprising:

an exposure unit including a plurality of light emitting elements, a substrate having recesses formed in the surface thereof, the plurality of light emitting elements being disposed in the recesses, and a mask having openings formed opposite the plurality of light emitting elements; and a development unit.

The exposure unit of the image forming machine of the present invention arranges the plurality of light emitting elements in the recesses formed in the substrate. Thus, light emitted by each light emitting element is reflected or absorbed by the wall of the recess, and is so inhibited from heading toward the mask opening opposed to the adjacent light emitting element. As a result, stray light is prevented. Hence, light from each light emitting element can be collected through the opening of the mask opposed to the relevant light emitting element. The present invention can also impart reflecting properties, particularly, to the surface of the recess. Thus, part of light radiated from the light emitting element is reflected by the reflecting surface of the recess and ejected through the opening opposed to that light emitting element, so that the efficiency of optical utilization can be increased.

In the image forming machine of the present invention, the photosensitive medium may be a medium which bears microcapsules enveloping a component varying in strength upon exposure, and a coloring material, and in which development is performed by the coloring material draining when the microcapsules are ruptured under pressure. The development unit may be a pressure developing device which presses the microcapsules for development.

The image forming machine of the present invention can include a carriage movable relative to the photosensitive recording medium, and having both the exposure unit and the development unit; and a feeding apparatus for moving the carriage relative to the photosensitive recording medium. Since the exposure unit and the development unit are simultaneously conveyed by the carriage, there is no need to move the carriage or the photosensitive medium for each of exposure and development independently. Moreover, the image forming machine can be decreased in size, and the manufacturing cost can be lowered.

The apparatus for moving the carriage relative to the photosensitive recording medium can be composed of a medium feeding device for feeding the photosensitive recording medium, and a carriage feeding device for conveying the carriage in a direction intersecting the direction of feeding of the medium feeding device. The photosensitive recording medium is fed in one direction by the medium feeding device, while the carriage is conveyed in a direction intersecting the one direction by the carriage feeding device. Thus, the number of the light emitting elements is markedly decreased compared with a line exposure system for exposing the entire range in the width direction of the photosensitive recording medium (a direction intersecting that one direction) in a blanket manner. Hence, the structure of the apparatus can be simplified, and the manufacturing cost decreased.

The pressure developing device can include a contact unit which contacts the photosensitive recording medium placed on a bearing surface, and the contact unit can have an urging member for urging the photosensitive recording medium so as to be compressed against the bearing surface. The urging member can press the photosensitive recording medium to perform development. Alternatively, the pressure developing device may have a base constituting a bearing surface, and an urging member for urging the photosensitive recording medium from the bearing surface side against the contact unit may be mounted on the bearing surface of the base. Further alternatively, an urging member may be provided on both of the contact unit and the bearing surface. The bearing surface may be flat or curved.

The image forming machine of the present invention may further include a control circuit for controlling the exposure unit and the feeding apparatus so as to light the light emitting elements in accordance with the moving position of the carriage on the basis of image data. The control circuit controls the exposure unit and the feeding apparatus so that an image can be formed automatically at desired positions adapted to image data.

DETAILED DESCRIPTION OF PREFERRED EMBODIMENTS

Embodiment 1

Figure 1:
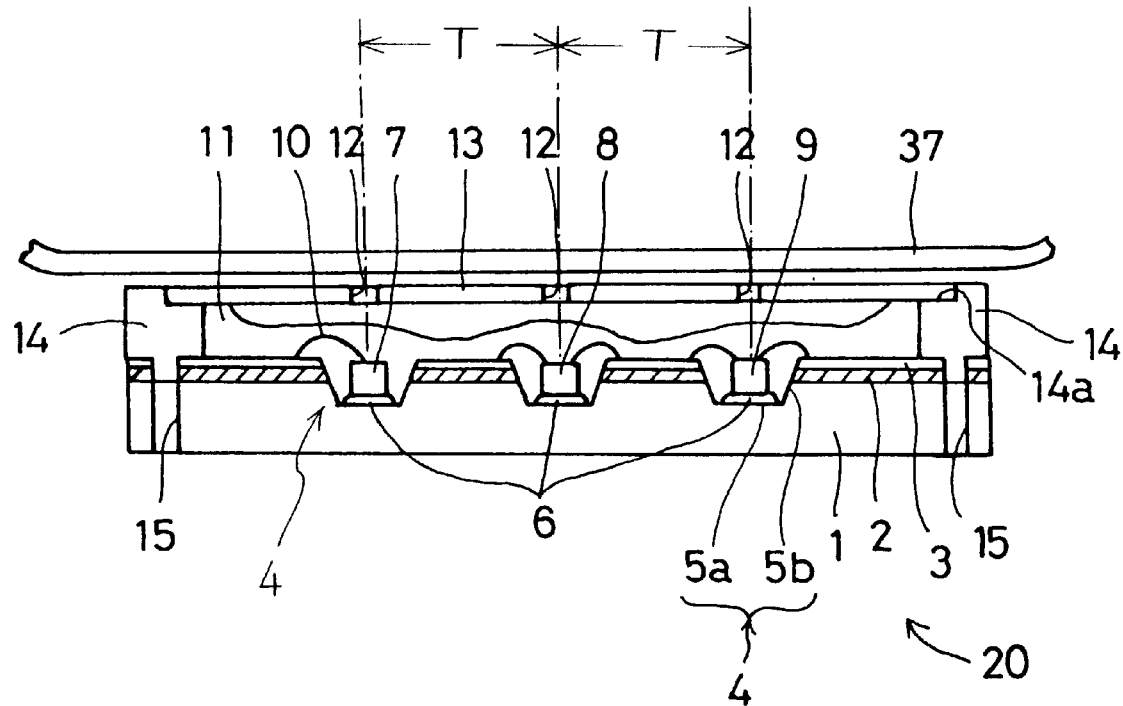
FIG. 1 is a schematic sectional view of an exposure unit of an exposure apparatus and an image forming machine in accordance with the embodiment 1 of the invention.

An embodiment of the present invention will be described by reference to the appended drawings. FIG. 1 is a schematic sectional view showing only an exposure unit of an exposure apparatus for exposing a microcapsule coated sheet as a photosensitive recording medium.

A substrate 1 on which an LED 9 as a light emitting element is mounted is formed by precision pressing aluminum using a known fine blanking press so that recesses 4 would be formed in the surface 5b thereof. The recess 4 is in the shape of an inverted truncated cone, having a bottom surface 5a parallel to the surface of the substrate 1, and an inclined side surface extending from the bottom surface 5a so as to spread upward. Three of the recesses 4 are arranged straight at equal intervals.

In the areas other than the recesses 4 on the surface of the substrate 1, an insulation layer 2 is formed. On the insulation layer 2, a lead pattern 3 is formed for transmitting electrical signals. The insulation layer 2 is a layer of an insulating material for providing insulation between the electrically conductive substrate 1 and the lead pattern 3. The lead pattern 3 is formed by etching a copper plating layer with a predetermined pattern.

On the bottom surfaces 5a of the recesses 4, a red LED 7, a green LED 8, and a blue LED 9 are disposed and fixed with an adhesive 6. The depth of the recess 4 defined by the substrate 1, insulation layer 2 and lead pattern 3 is nearly the same as the height of mounting for the red LED 7, green LED 8, or blue LED 9. The top of each of the red LED 7, green LED 8 and blue LED 9 is electrically connected to predetermined positions of the lead pattern 3 with a bonding wire 10. Each LED and the bonding wire 10 are sealed with a transparent sealing material 11 to shield them from the air.

The adhesive 6 is a silver paste for the red LED 7, and epoxy resin for the green LED 8 and the blue LED 9. This is because the bottom surface of the red LED 7 serves as one of the electrical terminals, and requires an electrical connection to the substrate 1 via a conductive adhesive 6; whereas the green LED 8 and the blue LED 9 have both electrical terminals on the top surface, and thus use an insulating, transparent epoxy resin for bonding. Since the transparent adhesive 6 is used, output light, occurring inside the green LED 8 and the blue LED 9 and proceeding toward the bottom surface, passes through the transparent adhesive 6. Then, it is reflected by the bottom surface 5 of the recess 4 and ejected from the top surface, thus increasing output light.

The red LED 7 uses AlGaAs as its basic material, and may be of the DDH structure known to give high output. The central wavelength of output light is about 650 nm. Two electrical terminals are present, one on the top surface, and one on the bottom surface. The green LED 8 and the blue LED 9 may each use GaN as the basic material. The central wavelengths of output light are about 525 nm and about 470 nm, respectively. Each of these LED's has two electrical terminals on the top surface, but has none on the bottom surface. When an electric current is flowed through the two electrical terminals in a predetermined direction, each LED emits output light in all directions in the space. The omni-directionally emitted output light partially heads directly upwards in the drawing. The other part of the light is reflected by the side surface 5b of the recess 4, and similarly sent upwards in the drawing.

The bonding wire 10 consists of a gold wire, which is bonded to the top surface of each LED and the lead pattern 3 by heating or ultrasonically.

The sealing material 11 is formed of a thermosetting resin, which is normally a transparent silicone resin or JCR. The thermosetting conditions are normally a temperature of 150° C., and a time of about 1 hour. An ordinary semiconducting material, such as an LED, rapidly deteriorates in properties when exposed to air, because its surface is oxidized or absorbs moisture. The sealing material 11 is used to avoid this action and protect the bonding wire 10, etc. from breakage by mechanical shock.

Above the substrate 1, a mask 13 with a plurality of pinholes 12 is positioned via a mask holding member 14. The mask holding member 14 is mounted and fixed to positioning boss holes 15 of the substrate 1. On an upper end surface of the mask holding member 14, a positioning groove 14a is formed for holding the mask. The mask is fitted in the positioning groove 14a, and the mask 13 is fixed integrally with the substrate 1 by a fixing means such as bonding or screwing. In this embodiment, the mask 13 is integrated with the substrate 1 by means of the sealing material 11.

The mask 13 is formed of a stainless steel sheet about 0.1 mm thick, and its contour and pinholes 12 are processed or formed by etching. Its surface is dyed black by dipping for reflection-free treatment of light.

Figure 6:
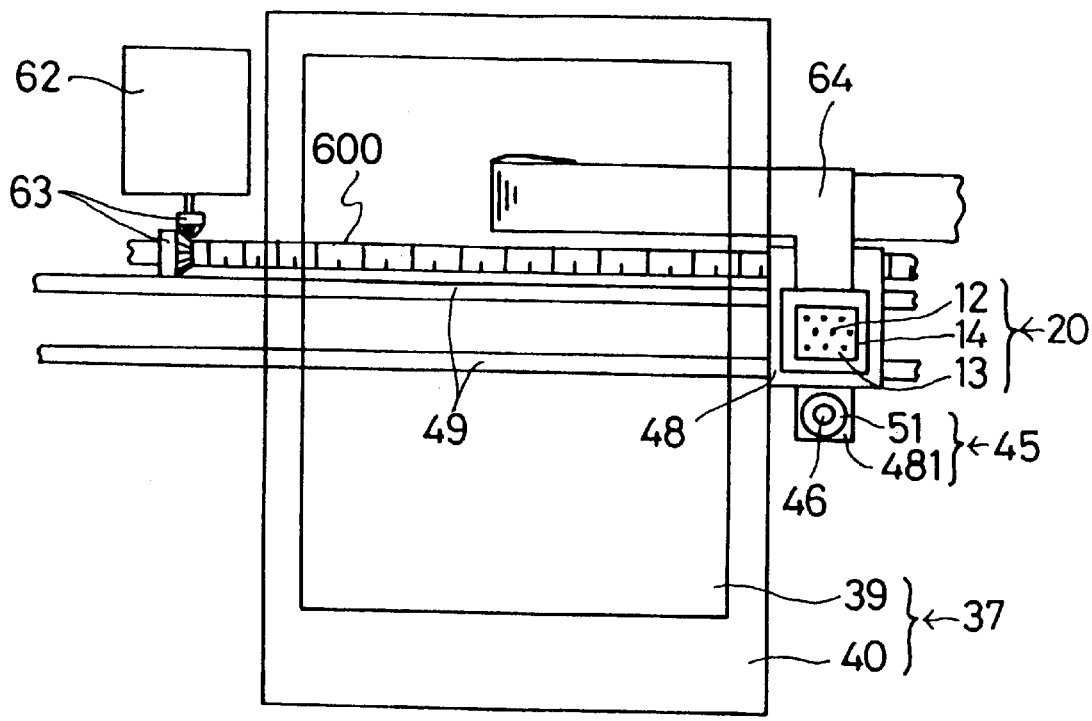
FIG. 6 is a bottom view of a photosensitive, pressure-sensitive printer for treating the microcapsule coated sheet, which is used in the embodiment 1 of the invention.

The pinholes 12 are formed to have a diameter of about 0.2 mm, and this hole diameter determines the resolution of an optical pattern to be given to a photosensitive recording medium. The pinholes 12 are provided opposite the tops of the red LED 7, green LED 8 and blue LED 9, respectively, and arranged straight as shown in FIG. 6. Accordingly, the interval for the pinholes 12 (pinhole interval), T, is the same as the equal intervals for the three of recesses 4.

The mask holding member 14 is a molded product composed of a high precision heat resistant plastic material, and positions the mask 13 triaxially by relying on the positioning boss holes 15 on the substrate 1. As stated previously, a thermosetting resin is used for the sealing material 11. Thus, when the mask holding member 14 and the mask 13 are simultaneously positioned and fixed by bonding using the thermosetting sealing material 11, the mask holding member 14 should not be deformed at the setting temperature of the sealing material 11. For this purpose, a heat resistant material should be used for the mask holding member 14.

Using the so formed exposure unit 20, the surface of a photosensitive recording medium 37 fed in close proximity to the mask 13 is movingly scanned with close proximity kept. During this period, the respective LED's are individually modulated and driven in accordance with image information, whereby light of predetermined central wavelengths is supplied to predetermined sites with predetermined optical power for predetermined periods of time. Thus, a latent color image can be formed.

The optical utilization efficiency of the so constructed exposure unit (exposure apparatus) 20 will be explained using numerical examples by reference to FIGS. 1 and 2.

Figure 2:
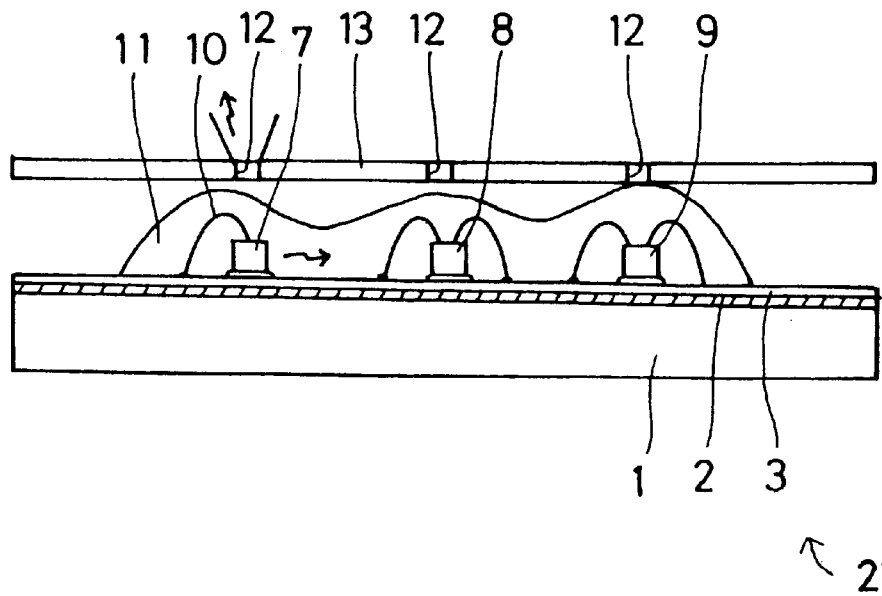
FIG. 2 is a schematic sectional view of an exposure unit of a conventional image forming machine.

FIG. 2 shows a schematic sectional structure of a conventional exposure unit 21. Its differences from the above-described exposure unit 20 are that no recesses are formed in a substrate 1 of the exposure unit 21, and respective LED's 7, 8 and 9 are mounted on the surface of the substrate.

The power of output light from the red LED 7 is 2 mW in terms of a total bundle of rays, when the LED is driven by a current of 20 mA at room temperature. The chip size of the red LED 7 is 0.3 mm in outer diameter and 0.2 mm in height. Optical power exiting from a pinhole 12 of a mask 13 1 mm apart from the chip top is 64 $\mu$W, corresponding to an optical utilization efficiency of 3.2%, under the same driving conditions, when there are none of the recesses 4 as in the present invention, and the LED chips are mounted on the flat substrate, as shown in FIG. 2. The optical utilization efficiency was nearly comparable for the green LED 8 and the blue LED 9.

With the exposure unit having recesses 4 according to the present invention as shown in FIG. 1, on the other hand, optical power from the pinhole 12 of the mask 13 one mm apart from the chip top was 120 $\mu$W under the same conditions, representing nearly a double increase in the optical utilization efficiency to 6.0%. The effect was almost comparable for the green LED 8 and the blue LED 9. The optical utilization efficiency can be increased further by decreasing the surface roughness of the side surface 5b, or forming the side surface 5b into a reflecting mirror having a specific curvature.

The problem concerning the stray light unnecessary for image formation may also arise. With the exposure unit 21 free of the recesses 4 shown in FIG. 2, the respective LED chips are mounted on the flat substrate. Thus, output light emitted laterally from the red LED 7 directly impinges on the green LED 8 and the bonding wire 10 connecting the green LED 8. The light is reflected thereby, and issued from the pinhole 12 that should eject green light. This stray light severely deteriorates the quality of a color image produced by the image forming machine. The use of the inventive exposure unit 20 illustrated in FIG. 1, by contrast, is substantially free from the direct impingement of output light from the red LED 7 upon the green LED 8 because of the side surface 5b of the recess 4. Furthermore, the mask 13 has been subjected to reflection-free treatment, so that the surface of the mask 13 absorbs light which is not directly ejected through the pinhole 12. Thus, there is no deterioration of image quality.

As regards the length and the bonding height of the bonding wire 10, assume that a wire bonder (bonding robot) is used for a bonding operation. The use of the exposure unit 20 according to the instant embodiment clearly produces marked effects, such that the bonding wire 10 is shortened, and actions of the robot can be simplified because the positions of bonding are at nearly the same height.

In FIG. 1, the size of the recess 4 should be the smallest possible one enough to accommodate each LED chip. This is effective to raise the optical utilization efficiency. An effective measure for achieving that size is to form the land pattern (lead pattern) 3 from the sites other than the recesses 4. This is partly because the formation of the land pattern 3 in the bottom surface 5a or side surface 5b of the recess 4 is difficult, when a small and relatively deep recess 4 must be formed.

The required energy density of the microcapsule coated sheet (the energy density at which the capsules are cured under exposure to light) to be described later on is about 3 J/m². This is abut 300 times the energy density, 10 m J/m², an example of sensitivity in silver salt photography. Thus, the energy required for the exposure of the microcapsule coated sheet is much greater than the energy given to a sensitive material in ordinary photographing.

When the above-mentioned red LED 7 is used for the exposure of the microcapsule coated sheet in the image forming machine of the instant embodiment, the power suppliable per red LED 7 for exposure of a 1 m² range over 600 seconds is 120 $\mu$W. Hence, a simple calculation formula with write duty=100% shows the need for forty-two red LED's 7. With the image forming machine lacking the recesses 4 as shown in FIG. 2, on the other hand, eighty-four red LED's 7, twice as large, are necessary.

A photosensitive recording medium to be exposed by such an exposure apparatus will be described in detail with reference to FIG. 3.

Figure 3:
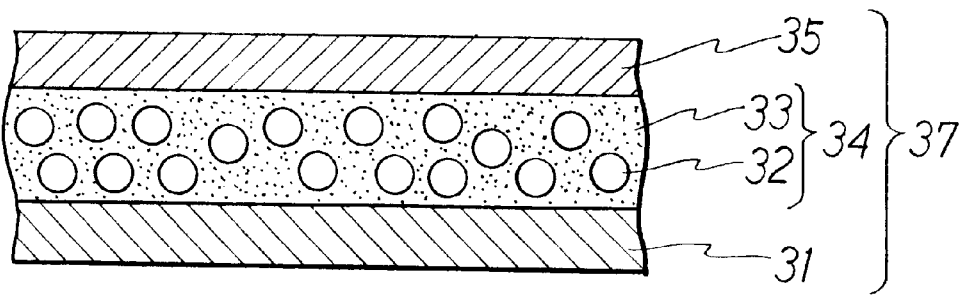
FIG. 3 is a sectional view of a microcapsule coated sheet used in the embodiments 1 and 2 of the invention.

FIG. 3 shows the cross-sectional structure of a microcapsule coated sheet 37 as a photosensitive recording medium. On the surface of a light transparent substrate 31, there is a mixed coating 34 formed from microcapsules 32 and a coreactant (developer) 33. The microcapsules 32 envelop a component which develops color upon contact with a coreactant as a coloring material (the component is a dye precursor or may be called a chromogen), and a component which changes in mechanical strength upon exposure to light of a predetermined wavelength (i.e. photocures; a photocuring resin). The coreactant 33 reacts with the dye precursor (chromogen) in the microcapsules. On the mixed coating 34, a sheetlike substrate 35 is superimposed.

The microcapsules 32 include three kinds of microcapsules, and each microcapsule envelops a colorless dye precursor for color development of one of the colors, yellow, magenta and cyan, a photocuring resin which sets when exposed to light of a wavelength for one of the three primary colors, and a polymerization initiator.

For example, when blue light (light of a wavelength of about 470 nm) is projected onto the microcapsule coated sheet, the photocuring resin of the microcapsules containing the dye precursor only for yellow is photocured. When a pressure is applied to the microcapsule coated sheet, the photocured microcapsules (those for yellow) are not broken, while the uncured microcapsules (those for magenta and cyan) are destroyed. As a result, the dye precursors for magenta and cyan drain from the microcapsules, and react with the developer, thus developing colors. These colors mingle to make a blue color. The blue color is observed through the transparent substrate 31.

When green light (light of a wavelength of about 525 nm) is projected onto the microcapsule coated sheet, the photocuring resin of the microcapsules containing the dye precursor only for magenta is photocured. Upon development under pressure, the microcapsules for yellow and cyan are destroyed. As a result, the dye precursors for yellow and cyan react with the developer, thus developing colors. These colors mingle to make a green color.

When red light (light of a wavelength of about 650 nm) is projected onto the microcapsule coated sheet, the photocuring resin of the microcapsules containing the dye precursor only for cyan is photocured. Upon development under pressure, the microcapsules for yellow and magenta are destroyed. As a result, the dye precursors for yellow and magenta react with the developer, thus developing colors. These colors mingle to make a red color.

When all the microcapsules are photocured as a result of exposure, development under pressure does not destroy them. Thus, no color development occurs, and the surface of the sheetlike substrate 35 can be visually observed through the transparent substrate 31. The color of the surface of the sheetlike substrate 35 (e.g. white) becomes a background color, and those parts that underwent a color development reaction form a color image. This principle of color development is designated herein as autocoupling or spontaneous color development. The surface of the light transparent substrate 31 of the microcapsule coated sheet is designated as a color development side surface.

In the instant embodiment, films of resins such as PET (polyethylene terephthalate) and polyvinyl chloride are exemplified as materials for the light transparent substrate 31.

Such sensitive materials relying on microcapsules are highly liable to influence from humidity. When stored under highly humid conditions, the light transparent substrate 31 and the sheetlike substrate 35 absorb moisture, and greatly change in sensitivity. Concretely, absorption of moisture increases the sensitivity. Depending on the temperature conditions during storage with high humidity, the sensitivity varies by a factor of about 10 or more. With the inventive image forming machine which exposes a sensitive material by a plurality of light sources at a constant exposure energy density, this cause of change poses a serious technical problem in maintaining image quality at a high grade.

To solve this problem, it is desirable to select a moisture resistant material for the light transparent substrate 31 and the sheetlike substrate 35, or coat their outer surface or inner surface (the surface on the capsule side) with a moisture resistant material. As examples of such a moisture resistant material, materials for optical lenses, such as amorphous polyolefins, can be widely chosen. As the coating material and coating method, vacuum deposition of $SiO_2$ is exemplified.

Another technical problem is that the microcapsules are irradiated with ultraviolet radiation through the light transparent substrate 31, whereby the capsules are colored yellow, changing the chromaticity and density of the white ground. To solve this technical problem, it is desirable to select a material with a low UV transmission for the light transparent substrate 31, or coat its outer surface or inner surface with a material having a low UV transmission.

As the microcapsules 32, known products can be used, such as walls of polymers, such as gelatin, polyamides, polyvinyl alcohols, or polyisocyanates, which envelop chromogens, such as triphenylmethane dyes or spiropyran dyes, photocuring resins comprising acryloyl-containing compounds, such as trimethylolpropane triacrylate, and photopolymerization initiators, such as benzophenone or benzoyl alkyl ethers.

As the coreactant 33, known developers can be used, such as acidic substances, e.g., acid clay, kaolin, inorganic oxides such as zinc oxide or titanium oxide, phenolic novolak resins, or organic acids, although the composition of the chromogen in the microcapsules may be relevant to the choice of the material.

To the microcapsules 32 and the coreactant 33, a binder, a filler, and a viscosity modifier are further added. These materials are coated on the light transparent substrate 31 by means of a spreading roller, spray, or a doctor knife to form the mixed coating 34.

The sheetlike substrate 35 may be a transparent, translucent or opaque substrate, such as paper (cellulose), synthetic paper, or a film of resin such as polyester or polycarbonate. The aforementioned measures to counter influences from humidity and UV rays should be taken for this substrate as well.

The image forming region (development areas) and boundary region (non-development areas) of the so constructed microcapsule coated sheet 37 will be described with reference to FIG. 4.

Figure 4:
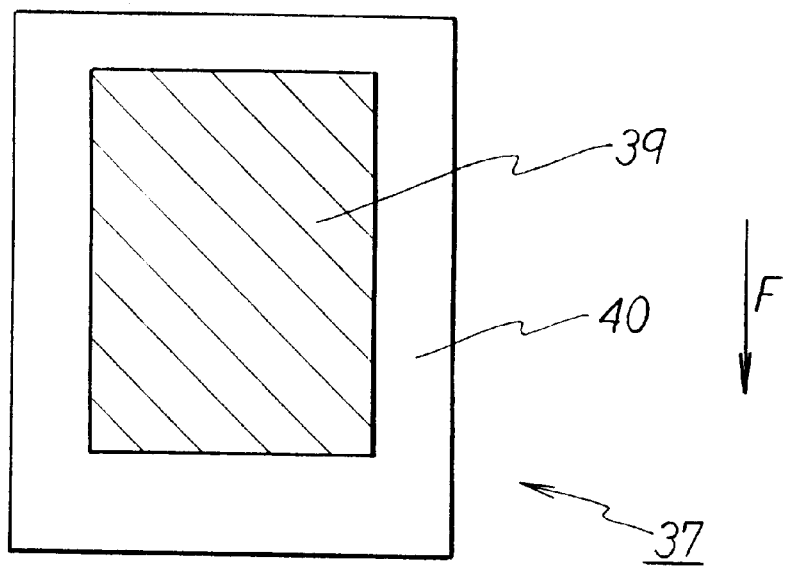
FIG. 4 is a plan view of the microcapsule coated sheet shown in FIG.3.

FIG. 4 is a plan view of the microcapsule coated sheet 37. In the microcapsule coated sheet 37, an image forming region 39 for expression of a high quality image is formed together with a boundary region 40 surrounding the image forming region 39. The boundary region 40 is defined as a region where a high quality image as in the image forming region cannot be formed, when the microcapsule coated sheet 37 is image-wise printed by a pressure sensitive, photosensitive printer to be described later on.

One of the methods for forming the boundary region 40 is to expose only the boundary region 40 to strong white light at the plant, thereby fully curing all the microcapsules in this region. The already cured microcapsules are not ruptured by development under pressure. Thus, the internal phase (dye precursor) necessary for image development is not liberated, so that this region defines a range to be expressed as a white frame in the printer output. Instead of such pre-exposure to white light, it is also permissible to expose that region beforehand to a simple pattern using light of a predetermined wavelength. This boundary portion may be developed under pressure simultaneously with, or prior to, exposure and pressure-development of a desired image (high quality image). Alternatively, the boundary portion may be formed in the same manner as for the development portion, and only the development areas may be exposed and subjected to development under pressure. This method, however, causes destructible capsules to remain in the boundary region (non-development areas), necessitating cautious handling. Preferably, therefore, the boundary region is exposed to white light before or after image-wise exposure for creation of a desired high quality image. The structure of the microcapsule coated sheet is described in detail in U.S. Pat. Nos. 4,399,209 and 4,440,846, and the contents of which are incorporated herein by reference.

Figure 5:
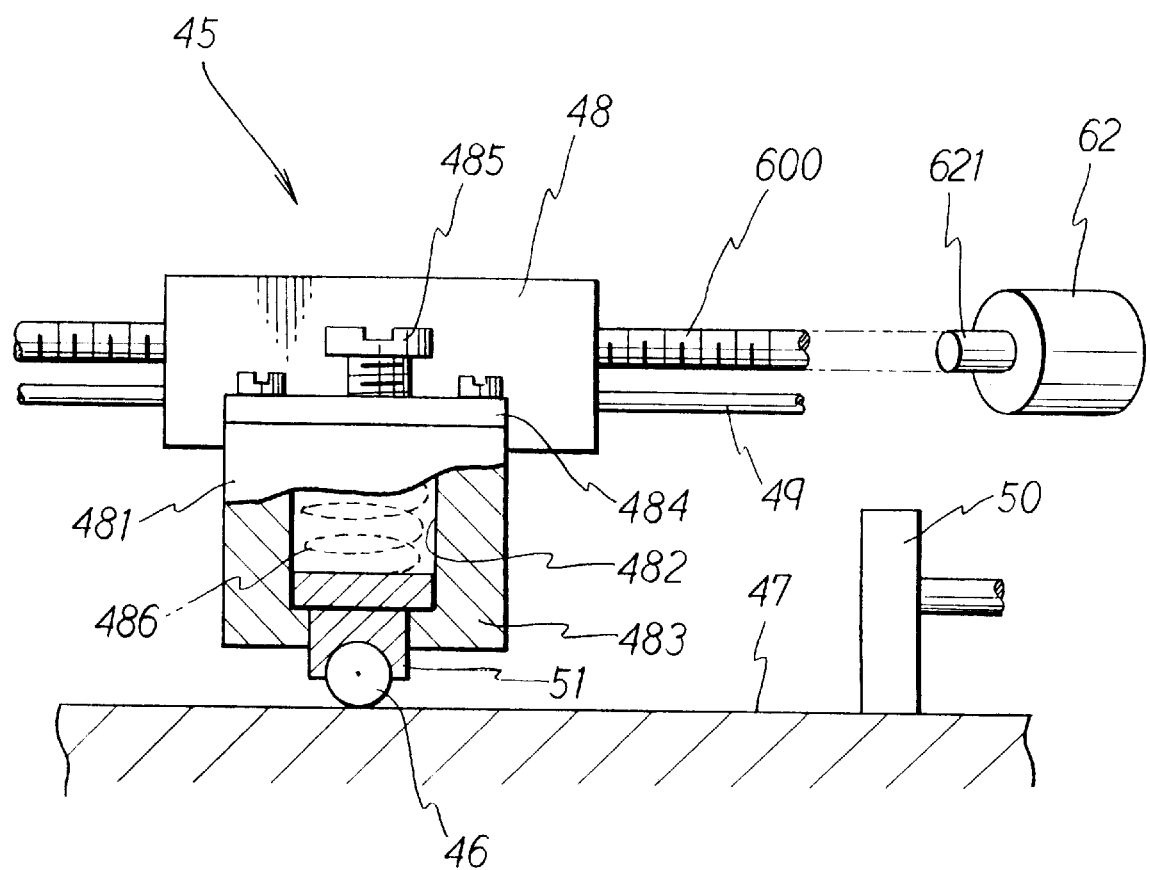
FIG. 5 is a structural view of a developing device for developing the microcapsule coated sheet under pressure, which is used in the embodiment 1 of the invention.

A development step for the microcapsule coated sheet is described with reference to FIG. 5. FIG. 5 shows an embodiment of a developing device 45 for developing a microcapsule coated sheet. For simplification, the microcapsule coated sheet that has been exposed is not shown in FIG. 5. The microcapsule coated sheet is supposed to be mounted on a nearly flat mounting base 47 which will be explained later.

The developing device 45 as a pressure developing apparatus achieves development by elastically pressing the surface of the microcapsule coated sheet in a point contact manner. This device 45 pressure develops only the development areas by pressing a point contact ball 46 against the microcapsule coated sheet while changing the position of pressing. To change this position of pressing, relative movement is generated between the point contact ball 46 and the microcapsule coated sheet parallel to the face of the microcapsule coated sheet. The point contact ball 46 may be moved relative to the microcapsule coated sheet, or the microcapsule coated sheet may be moved relative to the point contact ball 46. Alternatively, both the microcapsule coated sheet and the point contact ball 46 may be moved. To downsize the apparatus, it is preferred to reciprocate the point contact ball 46 monoaxially parallel to the microcapsule coated sheet, and move, during this motion, the microcapsule coated sheet in a direction crossing, preferably perpendicular to, the direction of movement of the point contact ball 46.

At the point of pressing by the point contact ball 46, the microcapsule is destroyed by a low pressing force for development under pressure. The material enveloped therein (the colorless dye precursor) drains, causing a color development reaction with the developer. Then, the relative movement of the point contact ball 46 and the microcapsule coated sheet results in the visualization of a color image in the development areas.

In FIG. 5, the mounting base 47 to which the microcapsule coated sheet for pressure development is fixed. This base 47 may be shaped like a roller rather than a flat surface so as to feed the microcapsule coated sheet.

At least one point contact ball 46 is disposed to elastically press and engage the microcapsule coated sheet, and this point contact moves back and forth in a constant range on the mounting base 47 that corresponds to the microcapsule coated sheet. That is, the microcapsule coated sheet conveyed by a transport roller (to be described later on) from an exposure stand is held by a holding feed roller 50 on the mounting base 47. The holding feed roller 50 is rotationally driven for each development line (to be described later on) by a feeding motor while pressing the non-development areas of the microcapsule coated sheet, and a pair of the holding feed rollers 50 are provided on both sides of the development areas.

A carriage 48 is supported so as to be free to reciprocate parallel to the surface of the base 47 and along a guide shaft 49 orthogonal to the direction of feeding of the microcapsule coated sheet. On the base 47 side of a ball support 481 of the carriage 48, the point contact ball 46 is rotatably supported via a ball socket 51. The ball 46 is housed so as to be slidable along with the ball socket 51 in an up-and-down direction in the drawing in a slide hole 482 formed in the carriage 48. At the upper end of the socket 51, a stepped portion 511 is formed. The stepped portion 511 contacts a stopper portion 483 provided at the lower end of the slide hole 482, thereby preventing a fall-off of the ball 46 and ball socket 51.

To the top surface of the ball support 481, a cover plate 484 is screwed for closing the top of the slide hole 482. An adjusting screw 485 is screwed into the cover plate 484. Between the shaft end of the adjusting screw 485 and the socket 51, a compression spring 486 is loaded as an elastic body, which urges the socket 51 to the stopper portion 483. However, the dimensions of the various parts are set such that the point contact ball 46 is contacted with and urged against the base 47 before the socket 51 is brought into contact with the stopper portion 483.

The force of urging the point contact ball 46 against the microcapsule coated sheet may be produced by using a pneumatic device, a hydraulic device or a solenoid instead of the compression spring 486. That is, an electromagnetic force may be used besides an elastic body. Alternatively, the base may be urged to the point contact ball instead of urging the ball against the base, or both the ball and the base may be urged in a direction in which they contact each other. In short, any urging means between the point contact ball and the base side (the microcapsule coated sheet side) may be employed.

A feed screw 600 is screwed into the carriage 48, and connected to an output shaft 621 of a feeding servomotor 62 so as to be rotated in normal and reverse directions. By the normal and reverse rotations of the feed screw 600, the carriage 48 is moved in a reciprocating manner parallel to the base 47. This reciprocating movement sequentially shifts the point of pressing by the point contact ball 46.

The feeding servomotor 62 can control the direction and amount of rotation, and has an encoder for detecting the amount of drive. The feeding servomotor 62 is controlled so as to be driven by a control circuit. An open loop control type pulse motor may be used as this feeding motor. This type of motor has no position confirming function, but can have a simplified drive circuit, achieving a decreased cost. In addition to the pulse motor, an ordinary DC/AC motor may be used. The reason for using a motor whose drive quantity can be controlled is that the amount of reciprocation of the carriage 48 must be set in accordance with the size of the development areas in order to pressure develop only the development areas of the microcapsule coated sheet.

The carriage 48 is moved along the guide shaft 49 to pressure develop one line. Once this pressure development is completed, the holding feed roller 50 is rotated by one line. The carriage 48 is moved again to carry out pressure development of one line. This action is repeated until the pressure development of all development areas is completed.

A process for scanning the surface of the photosensitive recording medium by use of the exposure unit (exposure apparatus) 20 of the present invention is described with reference to a schematic bottom view of a photosensitive pressure sensitive printer.

FIG. 6 is a bottom view of a photosensitive pressure sensitive printer with an exposure apparatus 20 in accordance with the present invention. For convenience's sake, the microcapsule coated sheet 37 is drawn as a see-through view illustrating the structure. The microcapsule coated sheet 37 is subjected to an exposure effect by the exposure unit 20 from the back side in the drawing.

As detailed in FIG. 1, the exposure unit 20 is composed of a mask 13 with pinholes 12, a mask holding member 14, and a substrate 1 (not shown). The exposure unit 20 is fixed onto the carriage 48 illustrated in FIG. 5, and the carriage 48 is mounted so as to be capable of reciprocating in a right-and-left direction in the drawing along the guide shaft 49. Here, the direction of arrangement of the pinholes 12 is parallel to the direction of reciprocation of the carriage 48, and there are three parallel rows of the pinholes.

Each pinhole row consists of three pinholes 12, and the red LED 7, green LED 8 and blue LED 9 are disposed opposite the three pinholes 12. Thus, as the carriage 48 is moved, one exposure line per pinhole row is formed on the microcapsule coated sheet 37. On each exposure line, the red LED 7, green LED 8 and blue LED 9 are controlled to be lit according to image information. For this lighting control, the mounting interval for the red LED 7, green LED 8 and blue LED 9 (the pinhole interval), T, is present, so that the exposure of one point on the exposure line is performed in the presence of a delay time, t, adapted to the mounting interval for the respective LED's and the moving speed of the carriage 48.

That is, for irradiation with red (R) light, green (G) light and blue (B) light to make a certain point (exposure point) white, the following steps, for example, are taken: When the pinhole 12 opposite the red LED 7 is positioned at that point, the red LED 7 is lit once or a plurality of times; when the pinhole 12 opposite the green LED 8 is positioned at that point after movement of the carriage 48 (after the delay time t), the green LED 8 is lit once or a plurality of times; and when the pinhole 12 opposite the blue LED 9 is positioned at that point after further movement of the carriage 48 (after the delay time t), the blue LED 9 is lit once or a plurality of times.

Since the three rows of pinholes are formed, the above-described lighting control is performed for each row, and three lines that have been exposed are formed simultaneously by a single movement of the carriage.

Each of the pinhole rows is used to perform a multiplicity of exposures at the same exposure position of the microcapsule coated sheet, thereby fully photocuring the microcapsules. The LED lighting control data used for the formation of the exposed line by the first pinhole row is used again when this exposed line comes opposite the second pinhole row as a result of sheet feeding. Thus, the exposed line is exposed again by the same data. Then, the exposed line is opposed to the third pinhole row as a result of further sheet feeding. At this time, the exposed line is exposed once again using the same data. Thus, when one exposure point on the exposure line is noticed, this point is exposed a number, n, of times by the first pinhole row, exposed a further n times by the second pinhole row, and exposed a still further n times by the third pinhole row.

To the carriage 48, as stated earlier, the developing device 45 is fixed which comprises the point contact ball 46, ball socket 51 and ball support 481. The position of mounting of the exposure unit 20 is upstream from the point contact ball 46 in the direction of feeding of the microcapsule coated sheet 37.

The carriage 48 bearing the exposure unit 20 and the developing device 45 is mechanically driven by the servomotor 62, a gear train 63, and the feed screw 600, and moved back and forth thereby.

The respective LED's of the exposure unit 20 are electrically driven by a drive circuit (not shown) via a flexible harness 64, and controlled to be turned on and off according to image information.

Figure 7:
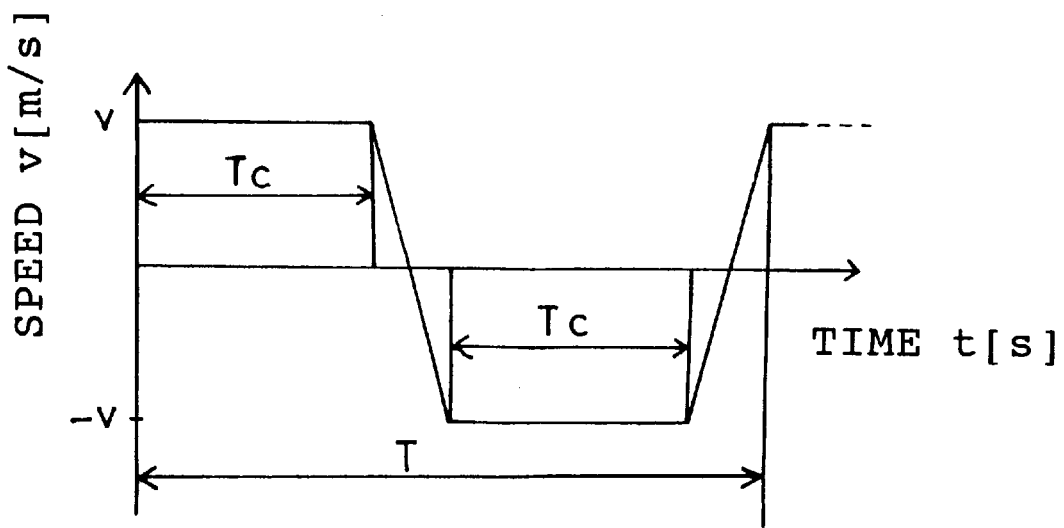
FIG. 7 is a graph showing the moving speed of a carriage.

FIG. 7 is a graph showing the time course of the moving speed of the carriage 48. The movement of the carriage will be described with reference to this drawing.

The carriage 48 is driven by the servomotor 62, etc. so as to reciprocate with a trapezoidal speed fluctuation pattern at maximum speed V [m/s], scan cycle T [s] and constant speed time Tc [s].

The microcapsule coated sheet 37 needs to be exposed and developed at a constant speed at least in its development areas 39. Thus, constant speed moving distance L [m] corresponding to the minimum constant speed time Tc necessary for exposing and developing the microcapsule coated sheet 37 is a range where at least all of the pinholes 12 pass through the development areas 39. This constant speed moving distance L [m] can be freely designed based on the width of the development areas 39, the arrangement pattern of the pinholes 12, and the maximum speed V [m/s].

The schematic entire structure of the photosensitive, pressure sensitive printer 80 for exposing and developing the microcapsule coated sheet is described by reference to FIG.

Figure 8:
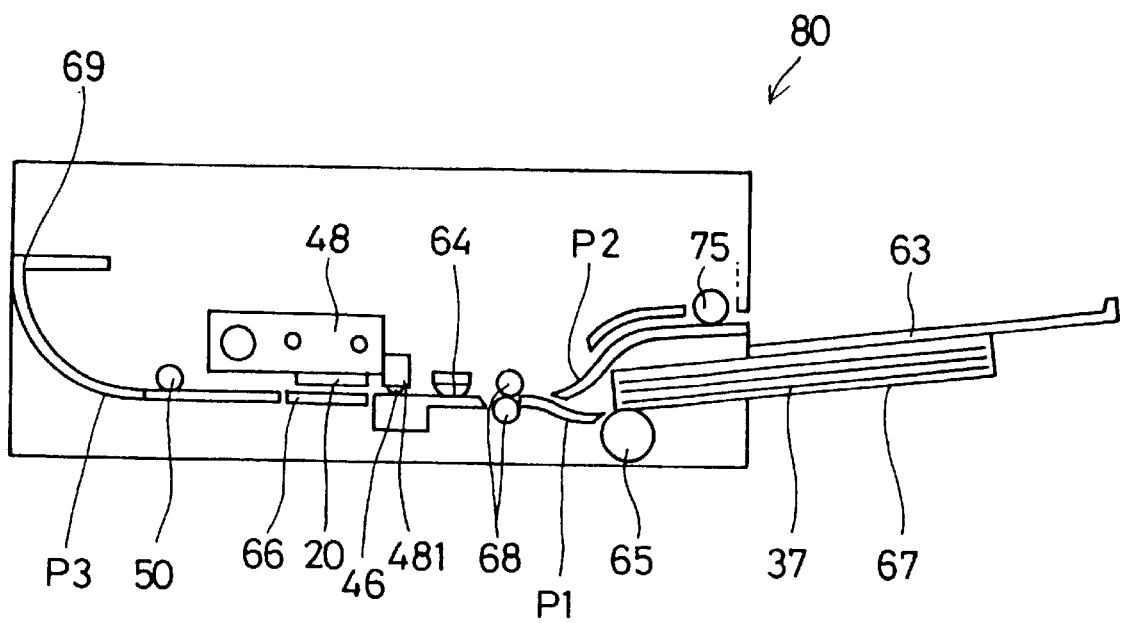
FIG. 8 is a structural sectional view of the photosensitive, pressure-sensitive printer for treating the microcapsule coated sheet, which is used in the embodiment 1 of the invention.

8. The photosensitive, pressure sensitive printer 80 (image forming machine) uses the exposure unit 20 shown in FIG. 1 and the developing device 45 shown in FIG. 5. Since the exposure unit 20 and the developing device 45 have already been explained, their explanations are herein omitted. FIG. 8 is a schematic sectional structural view of the photosensitive, pressure sensitive printer 80.

The photosensitive, pressure sensitive printer 80 uses the microcapsule coated sheet 37. Below the exposure unit 20 at the center of the photosensitive, pressure sensitive printer 80, an exposure stand 66 is held parallel to the exposure unit 20 at a tiny distance therefrom. Through this tiny distance, the microcapsule coated sheet 37 passes between the exposure unit 20 and the exposure stand 66. Thus, the exposure unit 20 makes a scan in the face-and-back direction of the drawing in FIG. 8 as illustrated with reference to FIG. 6, whereby a latent image corresponding to the image information in red, green and blue is formed in the selective range of the microcapsule coated sheet 37.

In the photosensitive, pressure sensitive printer 80, a light-tight cartridge 67 is disposed detachably, and the unexposed microcapsule coated sheets 37 are housed in the cartridge 67 in a stacked condition. The stacked condition is such that the light transparent substrate 31 of the microcapsule coated sheet 37 faces upward.

With the cartridge 67 being set in position in a frame of the printer, front end parts of the microcapsule coated sheet 37s are pulled out leftward toward the exposure stand 66. The unexposed microcapsule coated sheet 37 that has left the cartridge 67 is kept unexposed by a light-tight cover of the frame, and so on. The microcapsule coated sheets 37 are taken out of the cartridge 67 one by one by a sheet feed mechanism (roller) 65.

Leftwardly of the exposure stand 66, a stopper 69 is disposed at a position to which the microcapsule coated sheet 37 is sent and where the microcapsule coated sheet 37 is moved back. The printer 80 has a sheet passage comprising a send-in sheet passageway P1 for the microcapsule coated sheet 37 from the cartridge 67, a discharge passageway P2 branched from the passageway P1 and designed to guide the imaged microcapsule coated sheet 37 to a copy receiving or discharge tray 63 outside the machine, and a sheet reciprocation passageway P3 connected to the sheet passageway P1 and reaching the stopper 69 inside the machine.

The carriage 48 is disposed above the sheet reciprocation passageway P3, and on the right of the exposure unit 20 (on the sheet discharge side) the developing device 45 with the point contact ball 46 is disposed. On the sheet reciprocation passageway P3, a film heater 64 is disposed on the right of the carriage 48, and the sheet reciprocation passageway P3 extends up to a feeding roller 68. Leftwardly of the carriage 48 on the sheet reciprocation passageway P3, the holding feed roller 50 is disposed. Between the feeding roller 68 and the sheet feed roller 65, a bifurcation from the send-in sheet passageway P1 to the discharge passageway P2 is placed, and a discharge roller 75 is disposed on the discharge passageway P2. At the bifurcation, a sheet passageway switching plate (not shown) is disposed so as to be capable of switching movement. The sheet passageway switching plate separates from the send-in sheet passageway P1 when sending the microcapsule coated sheet into the machine by means of the sheet feed roller 65, and enters the send-in sheet passageway P1 and guides the microcapsule coated sheet to the discharge passageway P2 when discharging it.

The microcapsule coated sheet 37 that has went out of the lower part of the cartridge 67 is guided by the feeding roller 68, passed above the exposure stand 66, and sent to the stopper 69. Then, it is returned rightward, and subjected to an exposure action by the exposure unit 20. After passage through the developing device 45 for pressure development, the microcapsule coated sheet 37 is passed beside the film heater 64 to undergo heating. Thus, a final color output image is formed, and the sheet with this image is discharged outside the photosensitive pressure-sensitive printer 80 by the discharge roller 75. The film heater 64 is a thin film of polyimide or the like which comprises a pattern of an electrically conductive heating element formed by printing or the like, and which, when driven by an electric current, generates heat itself. The film heater 64 heats the microcapsule coated sheet 37, in which a color image has developed colors upon completion of development, to about 50° C. As a result, the capsules are completely cured, and the dye precursors are enclosed in the capsules, whereby the developed colors are fixed.

Figure 9:
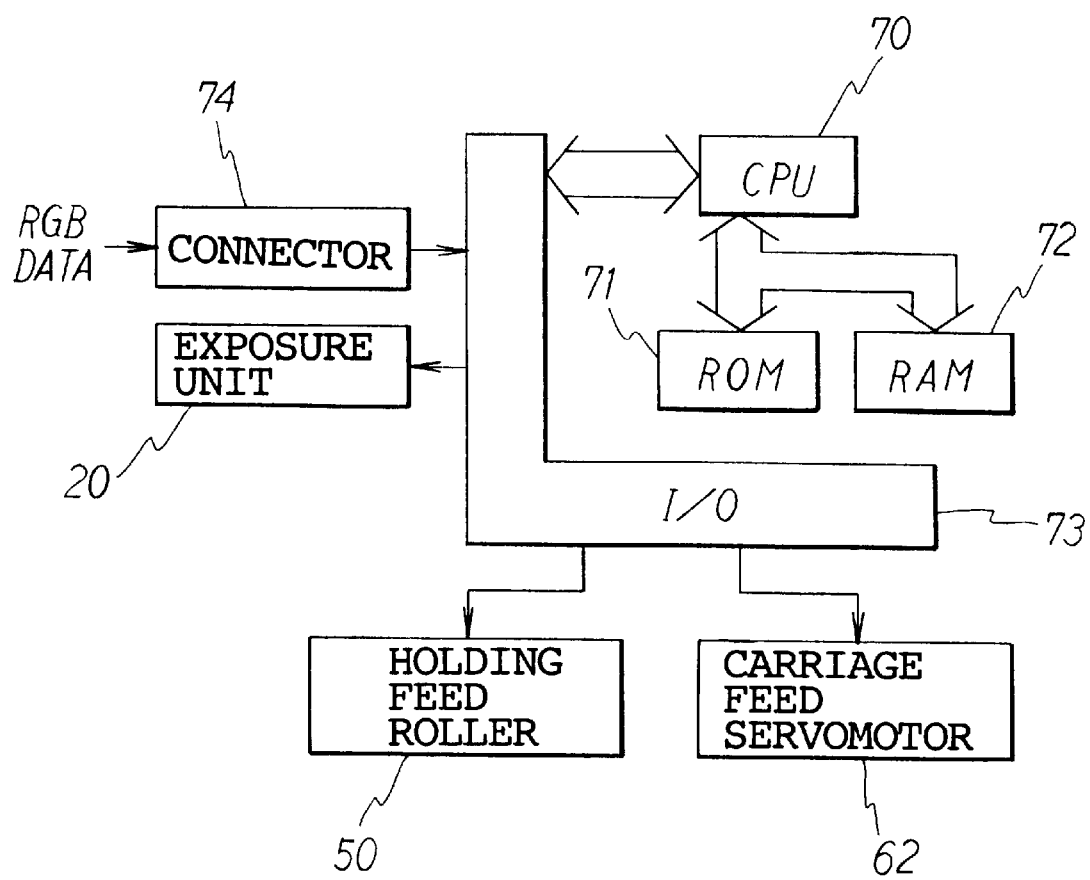
FIG. 9 is a block diagram showing the electrical constituents of the photosensitive, pressure-sensitive printer.

Next, the electrical structure of the control circuit in the photosensitive pressure sensitive printer 80 is described. FIG. 9 is a block diagram showing this electrical structure schematically.

The control circuit is composed of a well known logic operation circuit comprising a CPU 70, a ROM 71 and a RAM 72. To the CPU 70, a connector 74 is connected via an I/O port 73 for admitting RGB image data from an external host computer. Also to the CPU 70, the exposure unit (respective LED'S) 20, holding feed roller 50, and carriage feed servomotor 62 are connected via drive circuits.

The ROM 71 stores various programs, such as a program for controlling the actions of the entire machine; a program for computing and determining the duration and timing of lighting of the different-color LED's of the exposure unit 20 from the entered image data; a program for controlling the holding feed roller 50 in accordance with the sequence of RGB exposures to feed the microcapsule coated sheet 37; and a program for controlling the carriage feed servomotor 62 in accordance with the sequence of RGB exposures to scan the carriage in a reciprocating manner. The CPU 70 acts according to these programs. The RAM 72 stores data entered from an input panel (not shown), such as the number of copies, the magnification/reduction rate of image, and the size of the development areas of the microcapsule coated sheet 37 that have been set by the operator. The CPU 70 computes the driving conditions for the carriage feed servomotor 52 in accordance with the size data on the development areas, and performs exposure and pressure development based on the results.

The actions of the photosensitive pressure-sensitive printer 80 are described below.

When the cartridge 67 is set in the printer, one of the microcapsule coated sheets 37 is withdrawn by the sheet feed mechanism 65, conveyed leftward by the feeding roller 68, and guided to the position of the stopper 69. Then, it is returned rightward and guided to the underside of the exposure unit 20.

When the RGB data for output image is transmitted to the printer, this data is divided into R image data, G image data and B image data, and stored in the buffer of the RAM 72.

An explanation is offered herein with particular attention paid to one exposure point of the microcapsule coated sheet 37. As for the LED's of the first pinhole row, the red LED 7 is controlled to be lit in accordance with the R image data in timed relationship with the movement of the carriage 48. After lapse of the predetermined time t, the green LED 8 is controlled to be lit in accordance with the G image data. After a further lapse of the predetermined time t, the blue LED 9 is controlled to be lit in accordance with the B image data. This exposure control is performed for all the exposure points on one exposure line, whereby an exposed line is so formed by the first pinhole row. When this exposed line is opposite the second pinhole row upon sheet feeding, the respective LED's of this pinhole row are controlled to be lit for this exposed line on the basis of the same data. This procedure is repeated when the same exposed line is opposite the third pinhole row as a result of sheet feeding. Exposure from the first to third pinhole rows is thus performed for the same exposed line. Then, this exposed line is pressure developed by the point contact ball 46 upon sheet feeding. Thus, the exposed microcapsules are fully photocured, while only the non-photocured microcapsules are destroyed by pressure development, causing a color development reaction.

After development, the microcapsule coated sheet 37 is heated to about 50° C. by the film heater 64, whereby a final color output image is fixed. The sheet bearing this final image is discharged onto the discharge tray 63.

Herein, the carriage feed motor 62 and the holding feed roller 50 correspond to a feeding apparatus for moving the carriage relative to the photosensitive recording medium in the present invention. In the feeding apparatus, the holding feed roller 50 corresponds to a medium feeding device, wile the carriage feed motor 62 corresponds to a carriage feeding device.

As detailed above, the printer 80 as the image forming machine of the present invention is not limited to the foregoing embodiment, and may be changed and modified variously.

For example, the photosensitive recording medium is not limited to the above-described microcapsule coated sheet, but various changes and modifications are possible. In addition to the microcapsule coated sheet, silver salt films, diazotype papers, and any other photosensitive recording media may be used which are exposed to light and subjected to a development operation to show colors. The image forming machine using such a photosensitive recording medium gives the effects of the present invention. Alternatively, a photoconductor drum for latent electrostatic image formation for use in an electrophotographic printer may be exposed in accordance with the present invention.

Figure 10:
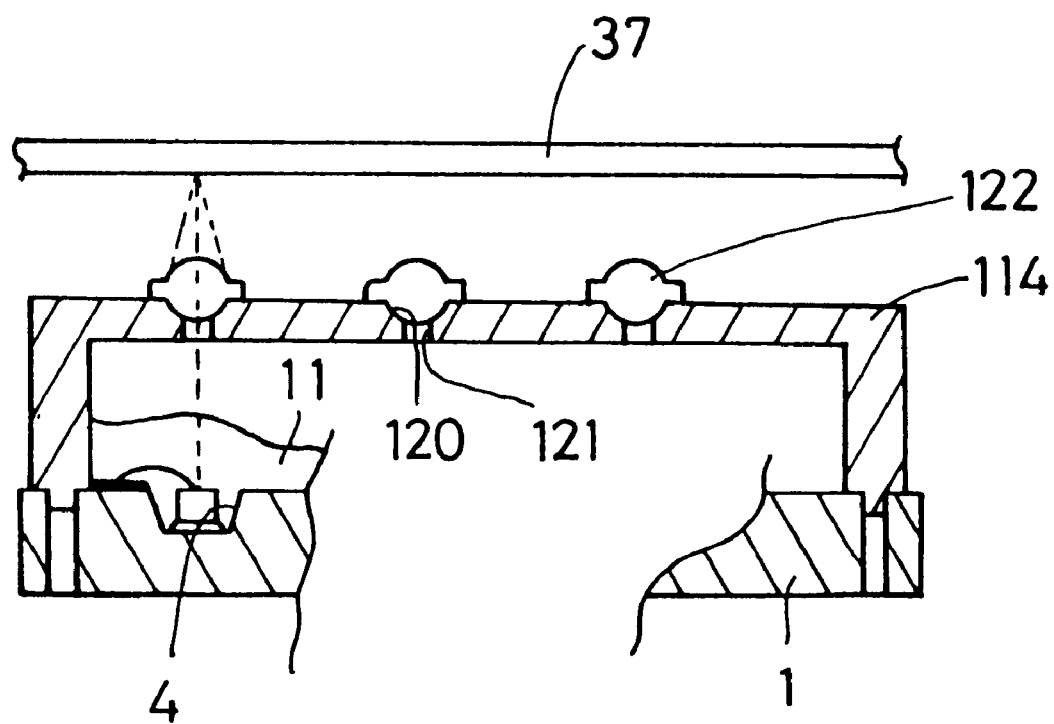
FIG. 10 is a schematic sectional view showing another an exposure unit of an image forming machine in accordance with the embodiment 1 of the invention.

To give openings as in a mask, use can be made of a mask, a thin sheet with pinholes, as well as of an image forming optical system such as a single plastic lens, as shown in FIG. 10. That is, light passage holes 121 opposite recesses 4 of a substrate 1 are formed in a holding member 114 fitted into positioning holes 15 of the substrate 1. Lens mounting portions 120 are formed in the peripheral edge parts of the light passage holes 121. Single plastic lenses 122 are mounted on the mounting portions 120. At the focal-point positions for the lenses 122, the microcapsule coated sheet 37 is disposed. Even when such lens systems are used, optical power entering the lenses is increased by the action of the recesses in the present invention. Eventually, there is no change in the effect of the present invention that optical power suppliable to the photosensitive recording medium increases, thereby raising the efficiency of optical utilization.

Embodiment 2

Figure 11:
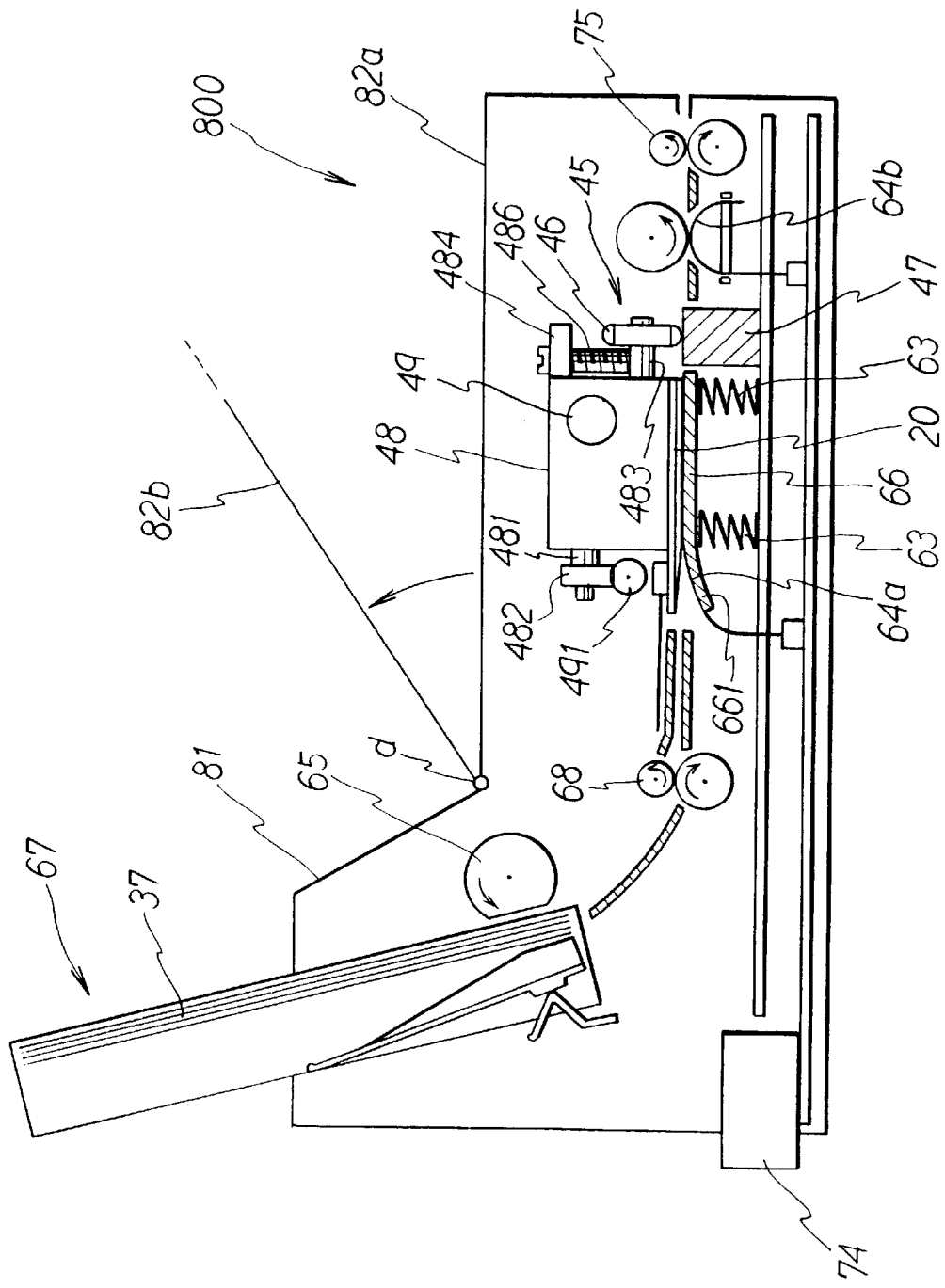
FIG. 11 is a sectional view of a photosensitive, pressure-sensitive printer for treating a microcapsule coated sheet, which is used in the embodiment 2 of the invention.
Figure 12:
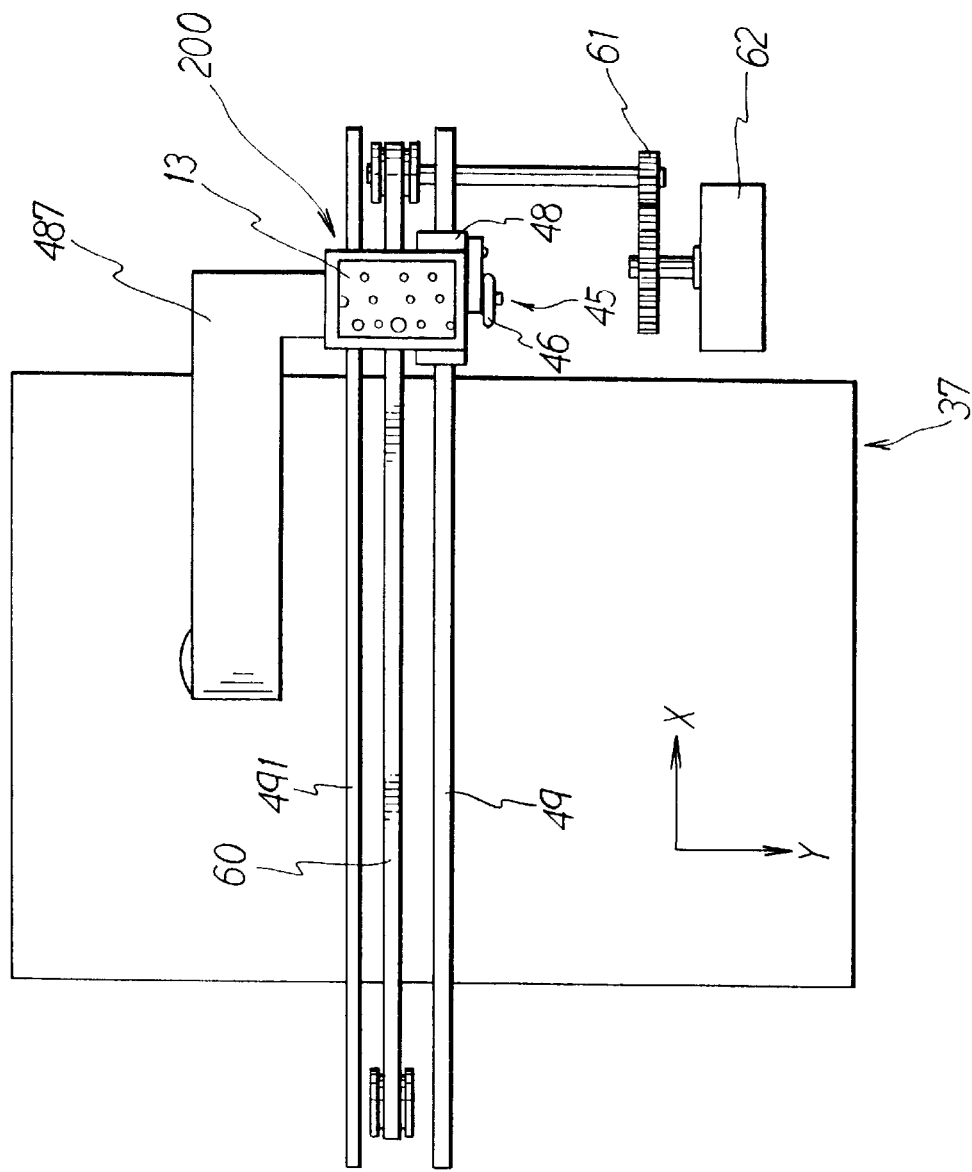
FIG. 12 is a bottom view of the essential part of the photosensitive, pressure-sensitive printer.

A second embodiment of the present invention will be described with reference to the accompanying drawings. FIG. 11 is a schematic side view showing an embodiment of a photosensitive pressure sensitive printer 80 as an image forming machine. FIG. 12 is a bottom view of the essential part of the photosensitive pressure sensitive printer 800.

The schematic entire structure of the photosensitive pressure sensitive printer 800 for exposing and developing a microcapsule coated sheet 37 (to be detailed later on) is described by reference to FIG. 11.

In an upper part of a case 81 in the photosensitive pressure sensitive printer 800, a light-tight cartridge 67 is disposed detachably, and the unexposed microcapsule coated sheets 37 are housed in the cartridge 67 in a stacked condition. The stacked condition is such that a light transparent substrate 31 (to be described later on) of the microcapsule coated sheet 37 faces upward.

With the cartridge 67 being set in position in the case 81 of the photosensitive pressure sensitive printer 800, the microcapsule coated sheet 37s are taken out of the cartridge 67 one by one by means of a semilunar sheet feed roller 65. A front end part of the microcapsule coated sheet 37 is pulled out rightward by a feeding roller 68 toward an exposure stand 66.

The exposure stand 66 is supported in the case 81 so as to be capable of contacting and leaving an exposure head 200 (to be described later on), and is urged upward by springs (urging means) 63. In the exposure stand 66, a guide 661 is integrally formed which extends from left to right in the drawing in a gradually curved shape from a position apart from the exposure head 200 to a position in contact with the exposure head 200. The forward end of the microcapsule coated sheet 37 conveyed by the feeding roller 68 is guided by the guide 661 and put into the gap between the exposure stand 66 and the exposure head 200 against the urging force of the springs. A preheater 64a, a film-like heater, is attached to that surface of the exposure stand 66 which is contacted by the microcapsule coated sheet 37. The preheater 64a is used to heat the microcapsule coated sheet 37 to a predetermined temperature in order to increase its photosensitivity during its exposure by the exposure head 200. Thus, as will be detailed later on, by scanning the exposure head 200 in a reciprocating manner, a latent image corresponding to the red-green-blue image information is formed in a selective range of the microcapsule coated sheet 37.

The unexposed microcapsule coated sheet 37 that has exited from the cartridge 67 is kept in an unexposed state by a light-tight cover of the case 81. To deal with a possible jam of the microcapsule coated sheet 37, a case cover 82a can be turned about an axis, d, perpendicular to the sheet face of the drawing, to settle at a position 82b. When the case cover 82a is in this open condition, the jammed microcapsule coated sheet in the case can be removed.

The carriage 48 is positioned above the exposure stand 66, and has the exposure head 200 on its underside. On the right of the carriage, a developer 45 having a pressure roller 46 is disposed. Further downstream on the sheet passage, a film-like postheater 64b is disposed on the right of the developer 45. Further downstream therefrom, a discharge roller 75 is disposed.

The carriage 48 is supported slidably on a round bar type guide shaft 49 secured in the case so as to extend along a direction perpendicular to the sheet face of the drawing (a direction perpendicular to the direction of transport of the microcapsule coated sheet 37). To the end surface of the carriage 48 on the exposure stand 66 side, the exposure head 200 is fixed. On the left end surface of the carriage 48, a shaft portion 481 protrudes on the microcapsule coated sheet 37 send-in side in a direction orthogonal to the guide shaft 49. On the shaft portion 481, a receiving roller 482 is supported rotatably. Inside the case, a receiving shaft 491 is disposed parallel to the guide shaft 49. The receiving roller 482 is borne on the upper surface of the receiving shaft 491, and caused to roll in association with the movement of the carriage along the guide shaft 49.

In FIG. 12, with the carriage 48 retreating laterally of the feed path of the microcapsule coated sheet 37, the unexposed microcapsule coated sheet 37 that has exited from the cartridge 67 is guided by the feeding roller 68, and sent to a site above the exposure stand 66. In this case, the surface of the unexposed microcapsule coated sheet 37 is heated by the preheater 64a to about 40 to 50° C. to increase its sensitivity during a subsequent exposure. Then, the sheet 37 is subjected to an exposure action by the exposure head 200, and passed through the developing device 45 for pressure development. Then, the sheet 37 is passed beside the postheater 64b for a heating action at about 60 to 80° C., whereby a final color output image is formed. The sheet with this final image is discharged outside the photosensitive pressure-sensitive printer 800 by the discharge roller 75.

The preheater 64a and postheater 64b are each a thin film of polyimide or the like which comprises a pattern of an electrically conductive heating element formed by printing or the like, and which, when driven by an electric current, generates heat itself. The postheater 64b heats the microcapsule coated sheet 37, in which a color image has developed colors upon completion of development, to about 60–80° C. As a result, the capsules are completely cured, and the dye precursors are enclosed in the capsules, whereby the developed colors are fixed.

As the photosensitive recording medium, the same microcapsule coated sheet 37 as shown in FIG. 3 is used.

The structure of the exposure head 200 of the present invention will be described with reference to FIGS. 13, 14A and 14B, and 15.

Figure 13:
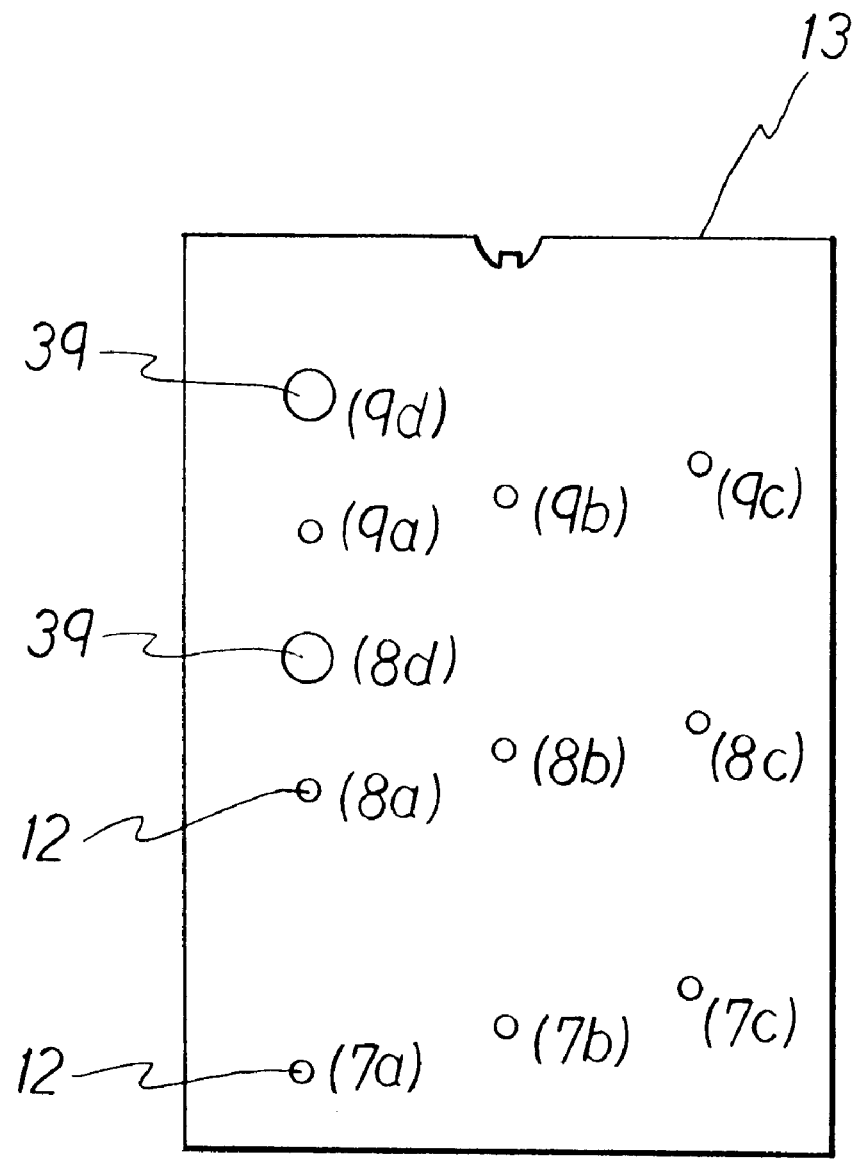
FIG. 13 is a plan view of a mask used in the embodiment 2 of the invention.
Figure 14A:
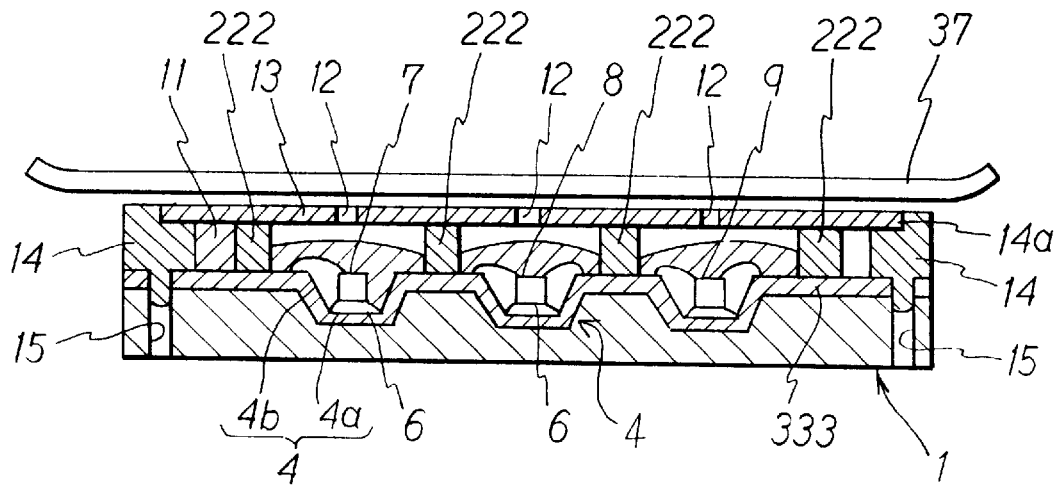
FIG. 14A is a schematic sectional view of an exposure head in accordance with the embodiment 2 of the invention.
Figure 14B:
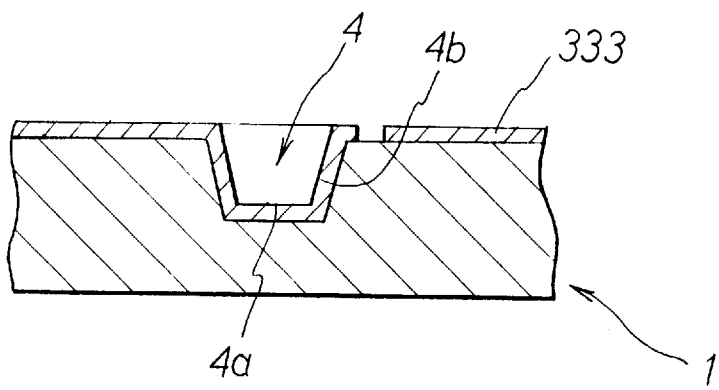
FIG. 14B is an enlarged sectional view of the essential part of the recess shown in FIG.14A.
Figure 15:
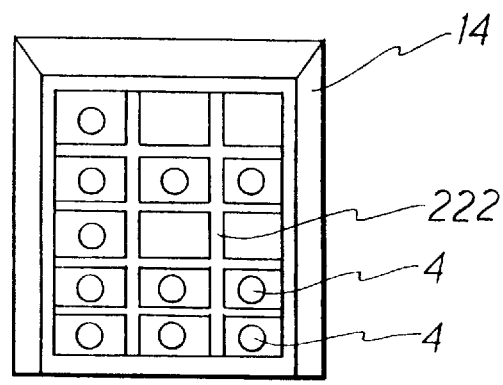
FIG. 15 is a plan view of a mask holding member shown in FIG.14A.
Figure 16:
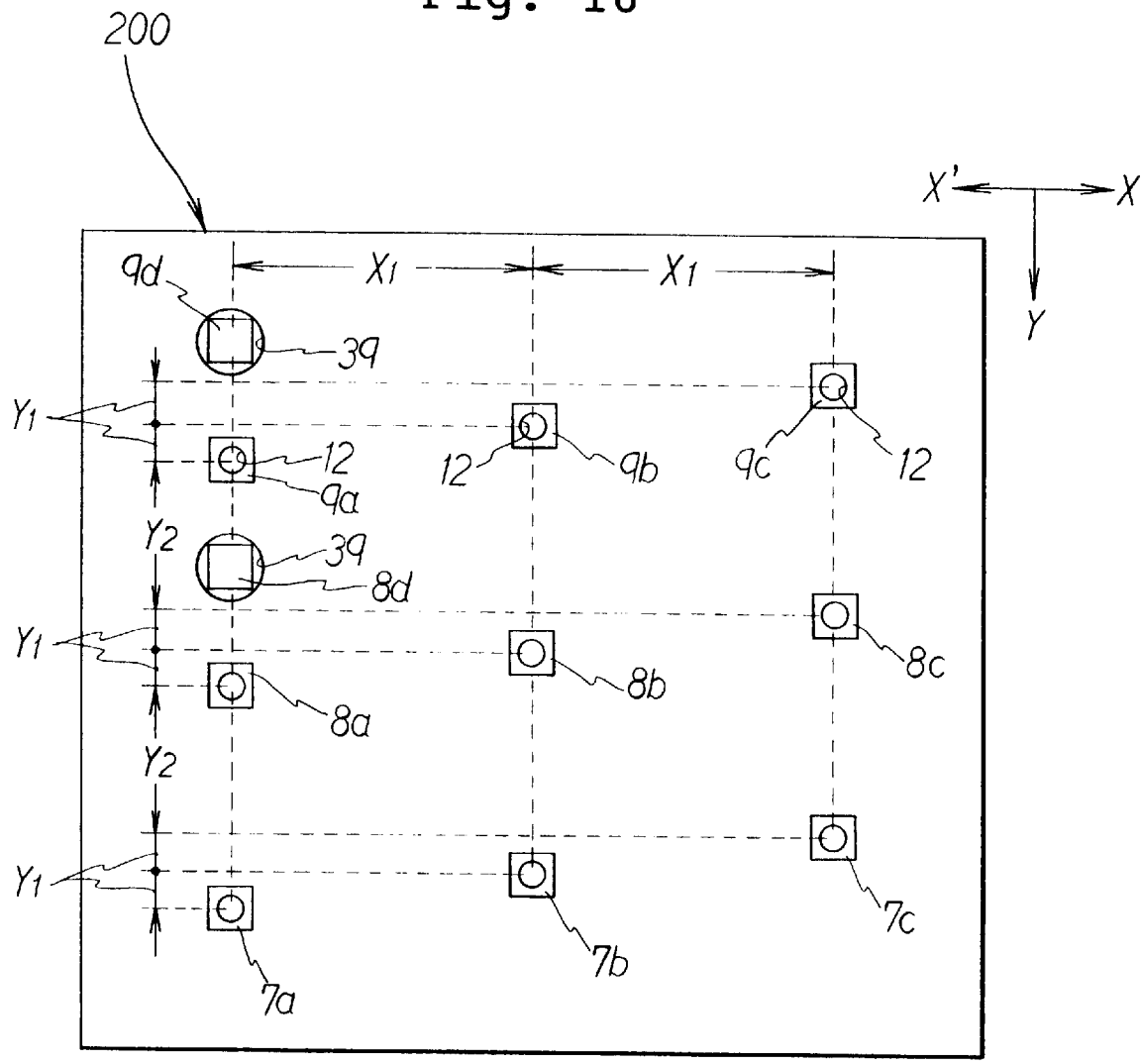
FIG. 16 is an explanatory drawing illustrating the arrangement of LED's used in the embodiment 2.

FIGS. 14A and 14B are each a schematic sectional view showing only the essential part of the exposure head 200 for exposing a microcapsule coated sheet 37 as a photosensitive recording medium. FIG. 13 is a top view of a mask 13. FIG. 15 is a top view of a mask holding member 14. FIG. 16 is an explanatory drawing illustrating the arrangement of light emitting elements (LED's).

The exposure head 200 has plural kinds of light emitting elements 7, 8, 9, a substrate 1 for supporting (fixing) them, a mask 13, and a mask holding member 14.

A flat plate-like substrate 1 of glass-epoxy resin is cut or pressed on the surface to form recesses 4 in the shape of an inverted truncated cone. On the surface of the substrate 1, an electrode layer 333 with a predetermined land pattern, as viewed from top, for transmitting electrical signals, is formed by electroless plating. The electrode layer 333 comprises a copper foil 35 $\mu$m thick. At the points of connection of the electrode layer 333 to a bonding wire, a nickel layer 5 $\mu$m thick and a gold layer 0.5 to 1.0 $\mu$m thick are further formed on the copper foil to construct a three-layer bonding pad. In this manner, a necessary number of recesses 4 are formed in predetermined places of the substrate 1, and then the electrode layer 333 with the predetermined pattern is formed. Then, LED's as light emitting elements are bonded to the recesses 4 using a silver paste or an epoxy adhesive.

As shown in FIG. 14B, the recesses 4 are each formed like an inverted truncated cone. Each recess 4 has a bottom surface 4a parallel to the surface of the substrate 1, and an inclined side surface 4b extending from the bottom surface 4a so as to spread upward. The electrode layer 333 on the surface of the substrate 1 is formed with a predetermined pattern along the surfaces of the recesses 4.

On the surface of the electrode layer 333 at the bottom surfaces 4a of the recesses 4, a red LED 7, a green LED 8, and a blue LED 9 are disposed and fixed with an adhesive 6. The depth of the recess 4 defined by the substrate 1 and electrode layer 333 is nearly the same as the height of mounting for the red LED 7, green LED 8, or blue LED 9. The top of each of the red LED 7, green LED 8 and blue LED 9 is electrically connected to predetermined positions of the land-patterned electrode layer 333 with a bonding wire 10. Each LED and the bonding wire 10 are sealed with a transparent sealing material 11 to shield them from the air.

As the adhesive 6, there is used a silver paste for the red LED 7, and epoxy resin for the green LED 8 and the blue LED 9 for the same reasons as explained previously in Embodiment 1.

The red LED 7 uses AlGaAs as its basic material, and may be of the DDH structure known to give high output. The central wavelength of output light is about 650 nm. Two electrical terminals are present, one on the top surface, and the other on the bottom surface. The green LED 8 and the blue LED 9 may each use GaN as the basic material. The central wavelengths of output light are about 525 nm and about 470 nm, respectively. Each of them has two electrical terminals on the top surface, but has none on the bottom surface. When an electric current is flowed through the two electrical terminals in a predetermined direction, each LED emits output light in all directions in the space. The omnidirectionally emitted output light partially heads directly upwards in the drawing. The other part of the light is reflected by the side surface 4b of the recess 4, and similarly sent upwards in the drawing.

The bonding wire 10 consists of a gold wire, which is bonded by heating and ultrasound to the top surface of each LED and the electrode layer 333 having the bonding pad.

The sealing material 11 is formed of a thermosetting resin, which is normally a transparent silicone resin or epoxy resin. The purpose of the use of the sealing material 11 is as mentioned in the Embodiment 1. In the instant embodiment, the sealing material 11 is also intended for bonding and fixing the mask 13 and the mask holding member 14.

Above the substrate 1, a mask 13 with a plurality of (the same number as the number of the light emitting elements) pinholes 12 in the shape of circular through-holes is positioned via a mask holding member 14. The mask holding member 14 is mounted and fixed to positioning boss holes 15 of the substrate 1. On an upper end surface of the mask holding member 14, a positioning groove 14a is formed for holding the mask. The mask 13 is fitted in the positioning groove 14a, and is fixed integrally with the substrate 1 by a fixing means such as bonding. In this embodiment, the mask 13 and the mask holding member 14 are integrated with the substrate 1 by means of the sealing material 11.

FIG. 15 is a top view of the mask holding member 14, and shows the positions of the recesses for convenience of explanation. The mask holding member 14 has a separating wall (partition) 222 formed integrally with the mask holding member 14 for separating the recesses 4, formed in the substrate 1, from each other. This separating wall 222, as shown in FIG. 14A, has its lower end surface in contact with the top surface of the non-recess region of the substrate 1 (including the top surface of the electrode layer 333), and its upper end surface in contact with the lower end surface of the mask 13. The optical propagation space between the substrate 1 and the mask 13 is separated by the separating wall 222 to define the respective light emitting elements (LED's). That is, a bundle of rays emitted by the LED disposed in a certain recess 4 exits only from the pinhole 12 of the mask 13 corresponding to that recess to the outside of the exposure head because of the presence of the separating wall 222 surrounding that recess; this bundle of rays never exits from the pinhole corresponding to any other recess.

Therefore, no stray light occurs, permitting the formation of a high resolution image.

The mask holding member 14 is a single molded product composed of a high precision heat resistant plastic material, and positions the mask 13 triaxially by relying on the positioning boss holes 15 on the substrate 1. To avoid the problem of stray light that output light from each light emitting element is ejected through the adjacent non-corresponding pinhole 12, the mask holding member 14 is designed to confine output light from each light emitting element (LED) in an individual space by the action of the separating wall 222. As stated previously, a thermosetting resin is used for the sealing material 11. Thus, when the mask holding member 14 and the mask 13 are simultaneously positioned and fixed by bonding with the use of the sealing material 11, the mask holding member 14 should not be deformed at the setting temperature of the sealing material 11. For this purpose, a heat resistant material should be used for the mask holding member 14. POM or the like can be selected as such a material. The mask holding member 14 with the separating wall 222 constitutes the optical separating means of the present invention. Alternative embodiments are the separating wall separate from the mask holding member, the separating wall integrated with the substrate side, and the separating wall integrated with the mask. Also, the shape of the space separated from one another may be various like square or round.

FIG. 13 is a top view of the mask 13. The mask 13 is formed of a stainless steel sheet about 0.1 mm thick, and its contour and pinholes 12 are processed or formed by etching. Its surface is dyed black by dipping for reflection-free treatment of light. The exposure head 200 of the present invention, possessing the optical separating means, has solved the problem of stray light to the adjacent light source. Thus, the present invention has obtained the effect of posing no problem, without performing such reflection-free processing.

The pinholes 12 are formed to have a hole diameter of about 0.2 to 0.18 mm, and this hole diameter determines the resolution of an optical pattern to be supplied to the microcapsule coated sheet 37 as a photosensitive recording medium. Auxiliary pinholes 39 with a hole diameter of 0.4 mm, approximately twice the hole diameter of the pinholes 12, are pinholes for auxiliary exposure as will be described later on. These pinholes 12, 39 are formed opposite the tops of the red LED 7, green LED 8 and blue LED 9. As shown in FIG. 16, three LED's 7a, 7b, 7c as a set of red LED's, four LED's 8a, 8b, 8c, 8d as a set of green LED's, and four LED's 9a, 9b, 9c, 9d as a set of blue LED's are disposed for image modulating exposure in the instant embodiment. One LED 8d for green and one LED 9d for blue are separately disposed as exposure light sources for auxiliary exposure which is not concerned with modulation of image (on-off controlling of the LED's for red, blue and green in accordance with image data in order to form a desired image). The reason behind this is that for green and blue, there is a region where the density of output image is unchanged upon optical exposure (region where the photosensitive resin of the microcapsules is not cured), until a certain energy density level is reached. Concretely, the microcapsule coated sheet gave numerical examples in which the color density did not change, even when the photosensitive material was exposed to ⅕ of the energy density necessary for maximum density change. By constantly irradiating this ⅕ energy density value, regardless of image modulating exposure, the number of LED's used can be decreased.

Among the red LED's, there are none for auxiliary exposure. This is because the microcapsules exposed to red light have no region where the density of output image is unchanged as for blue and green. That is, in the case of exposure to red light, the region undergoing no density change upon auxiliary exposure is not more than about ½₀ of the energy density necessary for maximum color density change.

A light source for auxiliary exposure is available only for light of the necessary wavelength. Thus, a single constant-duration optical emission results in comparable developed color density for each color (equal hardness of the photosensitive resin for each color). The photosensitive resin enveloped in the microcapsules varies in the degree of cure in proportion to the optical energy received. When the capsules are pressure developed, the dye precursor contained in the capsules drains outside in inverse proportion to the degree of cure. Thus, the density of the resulting image varies in proportion to exposure energy. In other words, the rates of the density of the respective colors developed become comparable to each other. As a result, the control of the exposure time and the number of exposures (the control of optical energy) equals for the respective capsules, thus facilitating the processing of image data. Otherwise, if the developed color density upon single modulation exposure varies with color, the energy must be changed with different colors in order to form an image of a predetermined tone. This requires a very complicated modulating control.

The pinholes for auxiliary exposure have a hole diameter of 0.4 mm, while the pinholes for image modulating exposure have a hole diameter of 0.2 to 0.18 mm. Hence, the opening area of the pinholes for auxiliary exposure is more than 4 times the opening area of the pinholes for image modulating exposure, thus giving more than 4 times as large optical energy passing through the opening.

Assume here that twelve LED's each for green and blue are necessary in a system performing exposure without auxiliary exposure. In this case, ⅕ of the twelve LED'S can be assigned to auxiliary exposure by one LED. Therefore, the exposure head for each of green and blue light can be composed of nine LED's for image modulating exposure and one LED for auxiliary exposure. In order that optical energy for auxiliary exposure will be supplied by one pinhole, its opening area has been determined. By so doing, the number of the LED's used can be decreased, achieving a low cost.

Since auxiliary exposure has nothing to do with image modulating exposure, the opening diameter of the pinhole can be made large. This makes the optical utilization efficiency high, producing the above-described advantages.

Of the red, green and blue LED's for image modulating exposure, as shown in FIG. 16, the three LED's 7a to 7c for red are arranged such that in the direction of reciprocation of the exposure head 200 (the first direction, the X direction in FIGS. 12 and 16), the distance, $X_1$, between LED 7a and LED 7b and the distance, $X_1$, between LED 7b and LED 7c are each an integral multiple of (say, 16 times) the size of one pixel (one dot) of an image to be formed in the microcapsule coated sheet 37; while in the direction of feeding of the microcapsule coated sheet 37 (the second direction, the Y direction in FIGS. 12 and 16), the distance, $Y_1$, between LED 7a and LED 7b and the distance, $Y_1$, between LED 7b and LED 7c are each the size to an integral multiple of the size, of one pixel (one dot) of an image to be formed in the microcapsule coated sheet 37.

The three green LED's 8a, 8b, 8c for image modulating exposure and the three blue LED's 9a, 9b, 9c for image modulating exposure are also arranged in the above manner. The distance, $Y_2$, between the red LED 7 set and the green LED 8 set in the second direction (the Y direction in FIG. 16) corresponds to 16 dots. The distance, $Y_2$, between the green LED 8 set and the blue LED 9 set in the same direction also corresponds to 16 dots.

The three green LED's 8c, 8b, 8a forming a set that are arranged with a spacing of $X_1$=16 pixels (16 dots) along the direction of reciprocation of the carriage 48 (the X direction in FIG. 16) are arranged with a spacing of $Y_1$=one pixel (one dot) in the direction of feeding of the microcapsule coated sheet 37 (the Y direction in FIG. 16). The three red LED's 7c, 7b, 7a forming a set that are arranged with a spacing of $X_1$=16 pixels (16 dots) along the direction of reciprocation of the carriage 48 (the X direction in FIG. 16) are arranged 12 dots ahead of the green LED set in the direction of feeding of the microcapsule coated sheet 37 (the Y direction in FIG. 16), and such that the red LED 7c and the red LED 7b are displaced by $Y_1$=one pixel (one dot) in the Y direction in FIG. 16, and the red LED 7b and the red LED 7a are also displaced by $Y_1$=one pixel (one dot) in the Y direction in FIG. 16.

Likewise, the three blue LED's 9c, 9b, 9a forming a set that are arranged with a spacing of $X_1$=16 pixels (16 dots) along the direction of reciprocation of the carriage 48 (the X direction in FIG. 16) are arranged 12 dots behind the preceding green LED set in the direction of feeding of the microcapsule coated sheet 37 (the Y direction in FIG. 16), and such that the blue LED 9c and the blue LED 9b are displaced by $Y_1$=one pixel (one dot) in the Y direction in FIG. 16, and the blue LED 9b and the blue LED 9a are also displaced by $Y_1$=one pixel (one dot) in the Y direction in FIG. 16.

In FIG. 16, $Y_2$=10 pixels, and the distance between the blue LED 9a and the red LED 7a is equivalent to 24 pixels in order to make this distance an integral multiple of the number of the LED's for each color (3 LED's in this embodiment).

The arrangement of the pinholes 12 drilled in the mask 13 is also set in harmony with the above-described arrangement of the LED'S.

The exposure head 200 of the foregoing constitution is moved at a predetermined speed V in the transverse direction in FIG. 12 (the X direction in FIG. 16), e.g., the +X direction, with modulating exposure being performed with the corresponding LED's in accordance with image data. Then, the microcapsule coated sheet 37 is fed by one exposure line in the longitudinal direction in the drawing (the Y direction in FIG. 16). Thereafter, modulating exposure is carried out while moving the exposure head 200 again at the predetermined speed in the -X direction. Then, the microcapsule coated sheet 37 is fed again by one exposure line in the Y direction, whereafter the exposure head 200 is moved again in the +X direction simultaneously with the modulating exposure of the LED's. This procedure is repeated until exposure for a desired image is completed. By so modulation driving the respective LED's individually in accordance with image information while making a moving scan, it becomes possible to supply light of predetermined central wavelengths to predetermined sites for predetermined periods of time with predetermined optical power, thereby forming a latent image for a color image. It goes without saying that the LED's for auxiliary exposure project light onto all of the image forming areas of the microcapsule coated sheet 37 regardless of the modulating exposure.

A process for scanning the surface of the photosensitive recording medium by use of the exposure head 200 of the present invention is described with reference to FIG. 12.

FIG. 12 is a bottom view of a photosensitive pressure sensitive printer with an exposure head 200 related to the present invention. For convenience's sake, the microcapsule coated sheet 37 is drawn as a see-through view illustrating the structure. The microcapsule coated sheet 37 is subjected to an exposure effect by the exposure head 200 from the back side in the drawing.

As detailed in FIG. 12 and FIGS. 14A, B, the exposure head 200 is composed of a mask 13 with pinholes 12, a mask holding member 14, and a substrate 1. The exposure head 200 is fixed onto the carriage 48 illustrated in FIG. 12, and the carriage 48 is mounted so as to be capable of reciprocating in a right-and-left direction in the drawing along a guide shaft 49.

To the carriage 48, a developing device 45 is fixed which comprises a point contact roller 46, etc. (to be described later on). The position of mounting of the exposure head 200 is upstream from the point contact roller 46 in the direction of feeding of the microcapsule coated sheet 37.

The carriage 48 bearing the exposure head 200 and the developing device 45 is supported slidably on the guide shaft 49 extending along a direction orthogonal on a horizontal plane to the direction of feeding of the microcapsule coated sheet 37 (namely, the X direction in FIG. 12), and is mechanically driven by a carriage drive motor 62, a gear 61, and a timing belt 60 so as to reciprocate.

Figure 17:
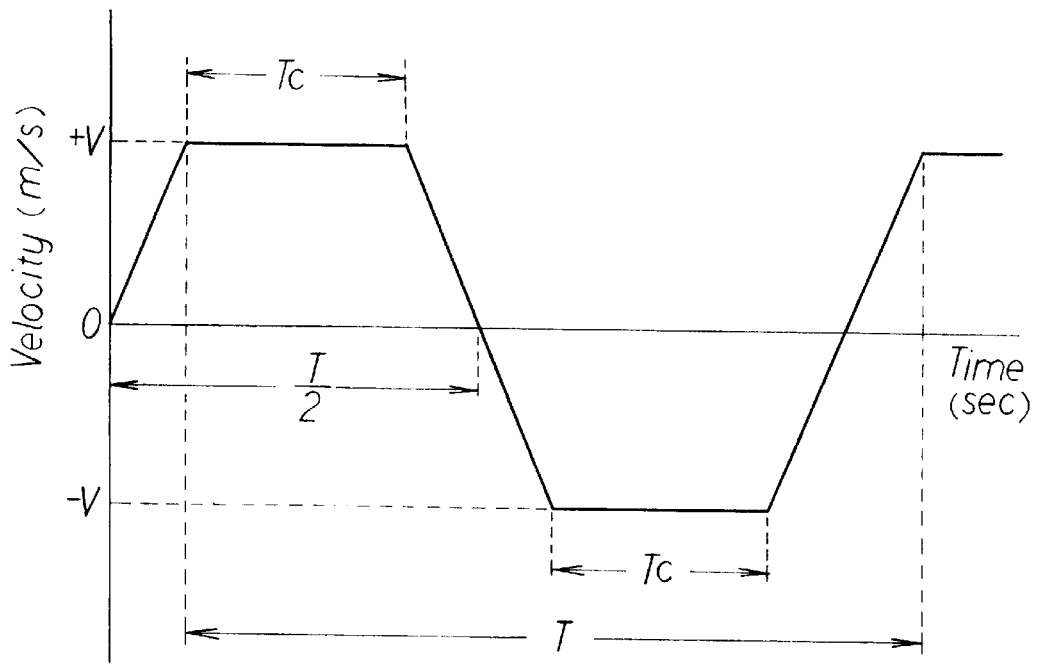
FIG. 17 is a graph showing the moving speed of a carriage used in the embodiment 2 of the invention.

FIG. 17 is a graph showing the time course of the moving speed of the carriage 48. The movement of the carriage will be described with reference to this drawing.

The carriage 48 is driven by the carriage drive motor (servomotor) 62, etc. so as to reciprocate with a trapezoidal speed fluctuation pattern at maximum speed V (m/sec), scan cycle T (sec), and constant speed time Tc (sec).

Assume, as shown in FIG. 17, that the carriage 48 is caused to reciprocate (scan in a reciprocating manner) along the X direction of FIG. 12 at maximum constant scan speed ±V (m/sec). In FIG. 17, the portions inclined relative to the time axis (horizontal axis) represent acceleration regions and deceleration regions between the transient stoppage at the moving end of reciprocation and the maximum constant scan speed ±V (m/sec). The time Tc is the time that the carriage 48 takes to pass through the entire distance in the width direction (X direction) of the microcapsule coated sheet 37 (the time required for the maximum constant scan speed). The scan cycle for the reciprocation is designated as T.

On each exposure line of the microcapsule coated sheet 37 (the line along the X direction in FIGS. 12 and 16), one set of the plural red LED's 7, one set of the plural green LED's 8, and one set of the plural blue LED'S 9 are each controlled to be lit according to image information. For this lighting control, the mounting interval for the one set of red LED's 7c, 7b, 7a, the one set of green LED's 8c, 8b, 8a, and the one set of blue LED's 9c, 9b, 9a (the pinhole interval), T, is present, so that the exposure of one point on the exposure line is performed in the presence of a delay time, t, adapted to the time required for the scanning movement of the carriage 48, and the time for the feeding of the microcapsule coated sheet 37 by that interval.

Figure 18:
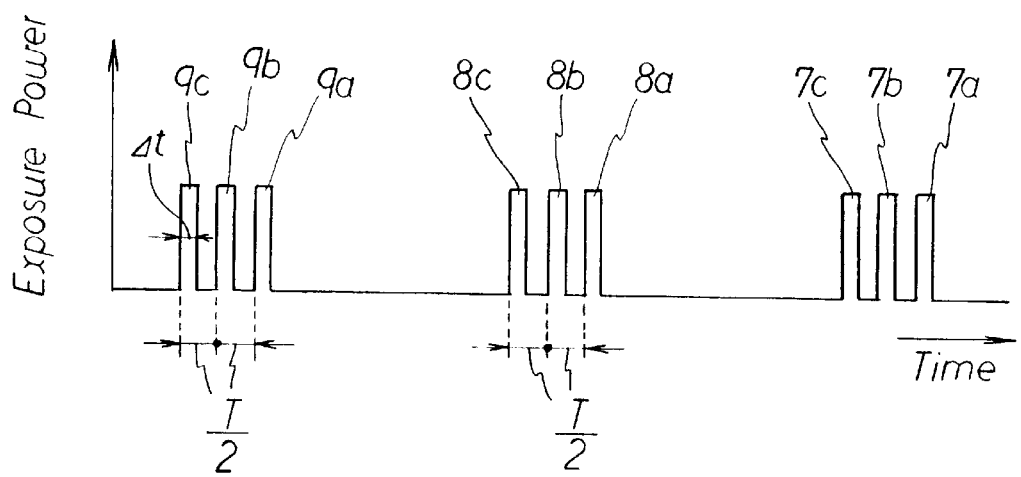
FIG. 18 is a graph showing the timing of multiple exposures for a single pixel which is used in the embodiment 2 of the invention.

That is, when $Y_1$=1 dot, one pixel of the microcapsule coated sheet 37 is to be given attention. For irradiation with green (G) light, red (R) light, and blue (B) light to make this particular point (exposure point) white, the following steps, for example, are taken: When the pinhole 12 opposite the blue LED 9c is positioned at that pixel point during the movement of the carriage 48 in a forward direction (in the X direction in FIG. 16), the blue LED 9c is lit once for a predetermined short time Δt. Then, the carriage 48 is stopped transiently at the end of the forward path. Thereafter, the microcapsule coated sheet 37 is fed by one dot in the Y direction of FIG. 16. Subsequently, during the movement of the carriage 48 in a return direction (in the X' direction in FIG. 16), when the pinhole 12 opposite the blue LED 9b is positioned at that pixel point, the blue LED 9b is lit once for a predetermined short time Δt, and the carriage 48 is stopped transiently at the end of the return path. Then, the microcapsule coated sheet 37 is further fed by one dot in the Y direction in FIG. 16. Then, during the movement of the carriage 48 in the forward direction (in the X direction in FIG. 16), when the pinhole 12 opposite the blue LED 9a is positioned at that pixel point, the blue LED 9a is lit once for a predetermined short time Δt. Thereafter, the carriage 48 is stopped transiently at the end of the forward path. This procedure, as shown in FIG. 18, enables one particular pixel point to be lit for a predetermined short time Δt each at a time in the order blue LED 9c→9b→9a after the lapse of a half of the scan cycle T.

Then, after the microcapsule coated sheet 37 is fed by 12 dots in the Y direction in FIG. 16, when the pinhole 12 opposite the green LED 8c is positioned at that noticed particular pixel point during the movement of the carriage 48 in the return direction (in the X' direction in FIG. 16), the green LED 8c is lit once for a predetermined short time Δt. Then, the carriage 48 is stopped transiently at the end of the return path. Thereafter, the microcapsule coated sheet 37 is fed by one dot in the Y direction in FIG. 16. Subsequently, during the movement of the carriage 48 in the forward direction (in the X direction in FIG. 16), when the pinhole 12 opposite the green LED 8b is positioned at that pixel point, the green LED 8b is lit once for a predetermined short time Δt, whereafter the carriage 48 is stopped transiently at the end of the forward path. Then, the microcapsule coated sheet 37 is further fed by one dot in the Y direction in FIG. 16. Then, during the movement of the carriage 48 in the return direction (in the X' direction in FIG. 16), when the pinhole 12 opposite the green LED 8a is positioned at that pixel point, the green LED 9a is lit once for a predetermined short time Δt. Thereafter, the carriage 48 is stopped transiently at the end of the return path.

Then, the microcapsule coated sheet 37 is fed by one dot in the Y direction in FIG. 16. Then, for the set of the red LED's 7 as well, the above lighting for the predetermined short time Δt is repeated in the order red LED 7c→7b→7a with the carriage 48 being moved back and forth.

During the above scanning exposure, not only the aforementioned image modulating exposure, but the auxiliary exposure by the blue LED 9d and the green LED 8d are constantly performed. The optical energy of the auxiliary exposure is set at maximum optical energy with which the capsules are not cured, as stated previously.

Hence, the optical energies for beams of different colors emitted by the blue LED's 9a to 9c, green LED's 8a to 8c, and red LED's 7a to 7c are equal. For light of the blue wavelength and light of the green wavelength, however, optical energy has been added as a result of auxiliary exposure by the blue LED 9d and the green LED 8d through the pinholes 39. Thus, the microcapsules for the difference colors are cured at the same rate. In this case, the degree of cure of the capsules for the different colors becomes the highest, and all the capsules are free from destruction even when pressure developed, with the result that no color development reaction occurs. That is, the color of the surface (white) of the sheet-like substrate 35 can be observed visually through the light transparent substrate 31.

Needless to say, optical energies emitted by the blue LED's 9a to 9c, green LED's 8a to 8c, and red LED's 7a to 7c for image modulating exposure are varied in accordance with the image data, whereby an exposed latent image corresponding to image data (an image patterned upon changes in the degree of cure of the capsules) is formed in the microcapsule coated sheet 37.

Figure 19:
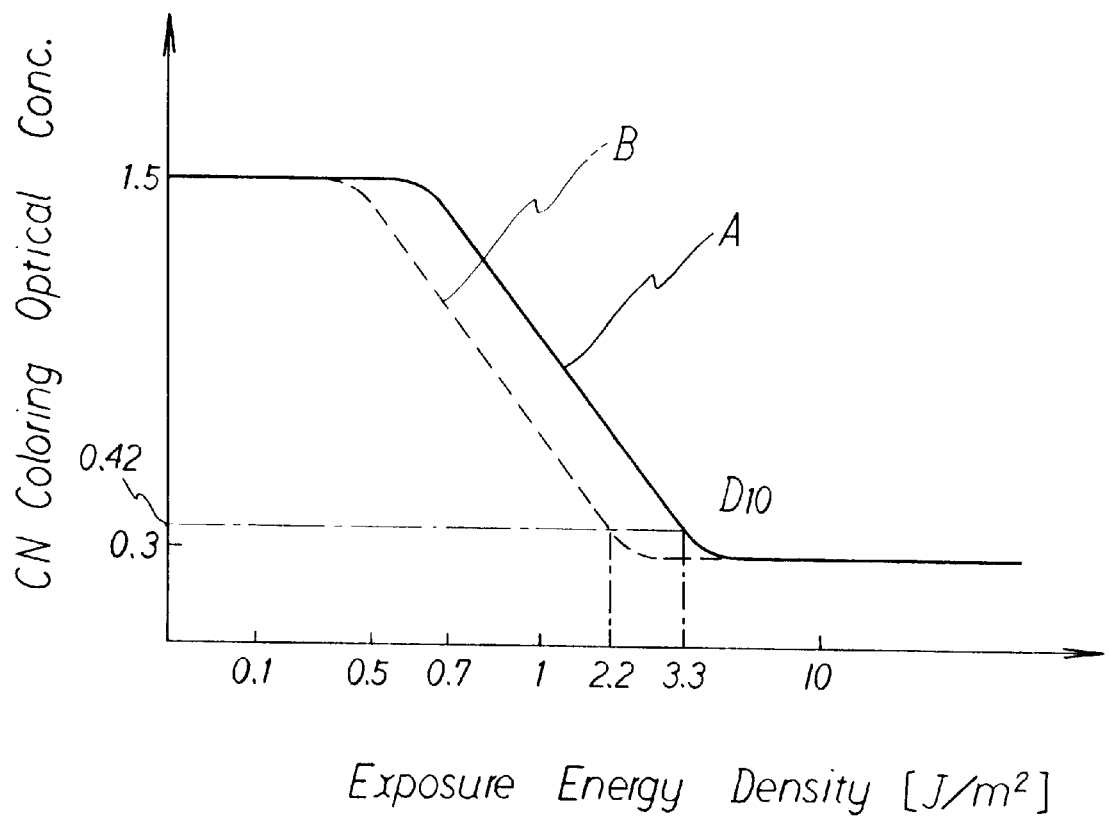
FIG. 19 is a graph illustrating the effect of multiple exposures which are performed in the embodiment 2 of the invention.

As described above, a plurality of exposures are applied at certain time intervals to the same exposure position (one pixel point) of the microcapsule coated sheet 37. The reason for this way of exposure, as shown in FIG. 18, is as follows:

As exemplified in FIG. 19, the optical density of developed cyan color is plotted as ordinates, and the total exposure energy density (J/m$^2$) as abscissas. In FIG. 19, the solid line A represents changes in the optical density of developed cyan color obtained when the red LED was lit only once, while the solid line B represents changes in the optical density of developed cyan color obtained when the red LED was lit in three divided doses at time intervals of a half of the scan cycle T.

In FIG. 19, to give a developed cyan color optical density at 10%, i.e., D10=0.42, one-time exposure needs to provide an exposure energy density of 3.3 (J/m$^2$). Whereas the triplicate exposure suffices if it gives a total exposure energy density of 2.2 (J/m$^2$).

As this comparison in FIG. 19 shows, to produce the same developed cyan color optical density in the exposure energy density range of 0.5 to 3.3 (J/m$^2$), exposure divided into three parts requires a smaller exposure energy density, while single exposure requires a larger exposure energy density.

The reason behind the above facts is as follows: The speed of polymerization reaction between the polymerization initiator and the photocuring resin of the microcapsules 32 in the microcapsule coated sheet 37 upon exposure to light is not so high. Rather than pouring in a large quantity of exposure energy at a time, injecting exposure energy little by little, at a plurality of (e.g., 2 to 6) stages at suitable time intervals, makes it easy for the polymerization reaction to proceed.

In other words, individual LED's each with low output, or a small number of LED's installed, would be able to give an adequate optical density of developed color.

By the way, the microcapsule coated sheet 37 is preferably exposed and developed at a constant speed over its entire surface. For this purpose, the moving distance L (m) at a constant speed corresponding to the minimum constant speed time Tc necessary for exposure and development of the microcapsule coated sheet 37 must be selected to be at least the range which all the pinholes 12 pass through. This constant-speed moving distance L (m) can be designed freely based on the width of the microcapsule coated sheet 37, the arrangement pattern of the pinholes 12, and maximum speed V (m/sec). Their numerical examples are L=0.1118 (m) and V=0.86 (m/sec). Based on these values, the entire surface of the microcapsule coated sheet 37 of the A6 size can be exposed and developed.

Figure 20:
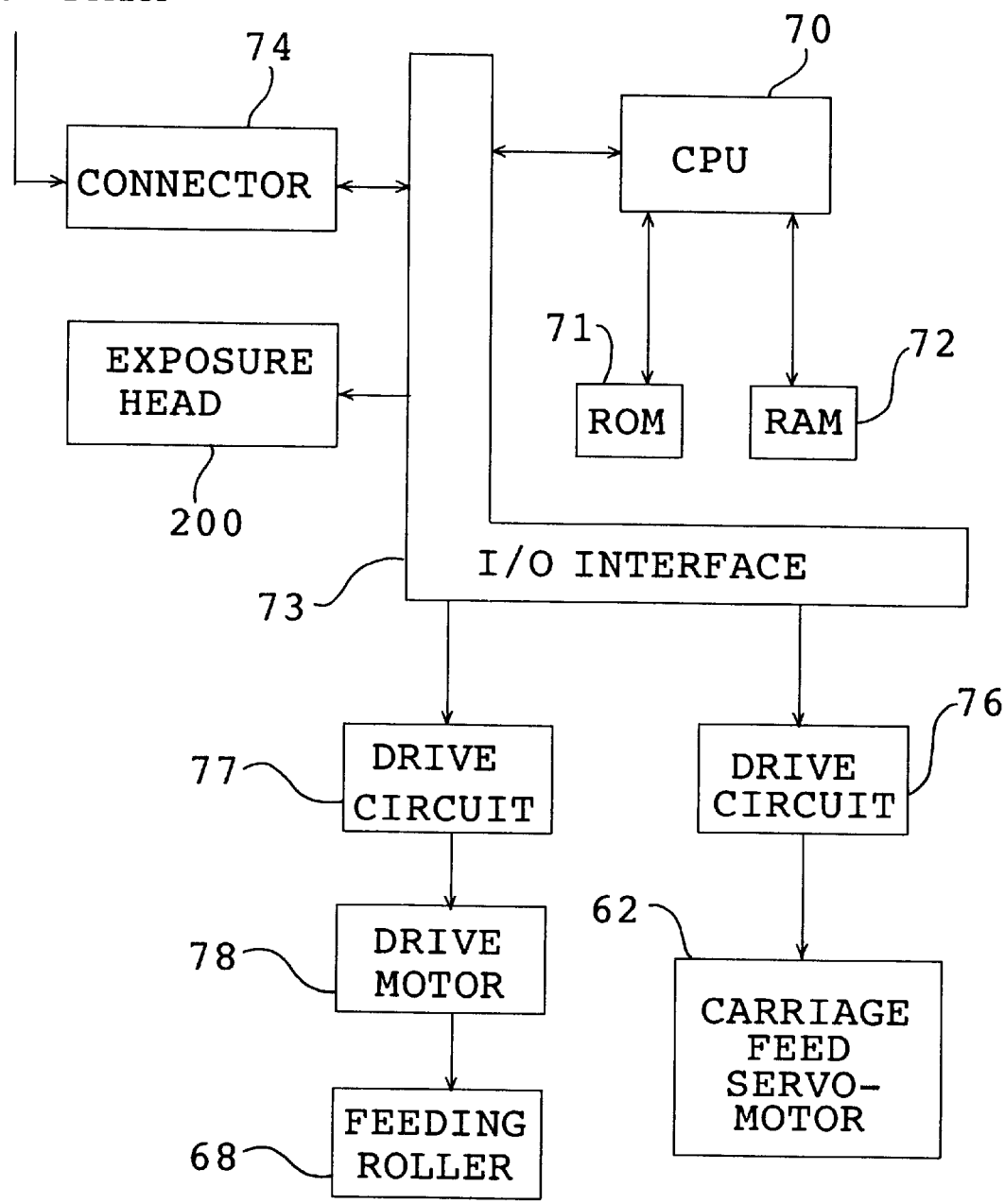
FIG. 20 is a block diagram showing the electrical constituents of a photosensitive, pressure-sensitive printer in accordance with the embodiment 2 of the invention.

Next, the electrical constitution of the present invention is described. FIG. 20 shows the electrical structure of a control circuit (control means) in a photosensitive pressure sensitive printer 800. The control circuit is composed of a well known logic operation circuit comprising a CPU 70, a ROM 71 and a RAM 72. To the CPU 70, a connector 74 is connected via an I/O port 73 for admitting RGB image data from an external host computer. Also to the I/O port 73, the exposure head (respective LED'S) 200, a drive circuit 77 for a drive motor 78 for the feeding roller 68, and a drive circuit 76 for the carriage feed servomotor 62 are connected.

The ROM 71 stores various programs, such as a program for controlling the actions of the entire machine; a program for computing and determining the duration and timing of lighting of the different-color LED'S of the exposure head 200 from the entered image data; a program for controlling the feeding roller 68 and discharge roller 75 in accordance with the sequence of RGB exposures to feed the microcapsule coated sheet 37; and a program for controlling the carriage drive servomotor 62 for carriage feed in accordance with the sequence of RGB exposures to scan the carriage in a reciprocating manner. The CPU 70 acts according to these programs. The RAM 72 is a buffer for transiently storing data entered from the outside. When the RGB data on output image is transmitted to the photosensitive pressure sensitive printer 800, this image data is sequentially stored in the buffer of the RAM 72.

The respective LED's of the exposure unit 200 are electrically driven by a drive circuit (not shown) via a flexible harness 487 (see FIG. 12), and controlled to be turned on and off according to image information.

Figure 21:
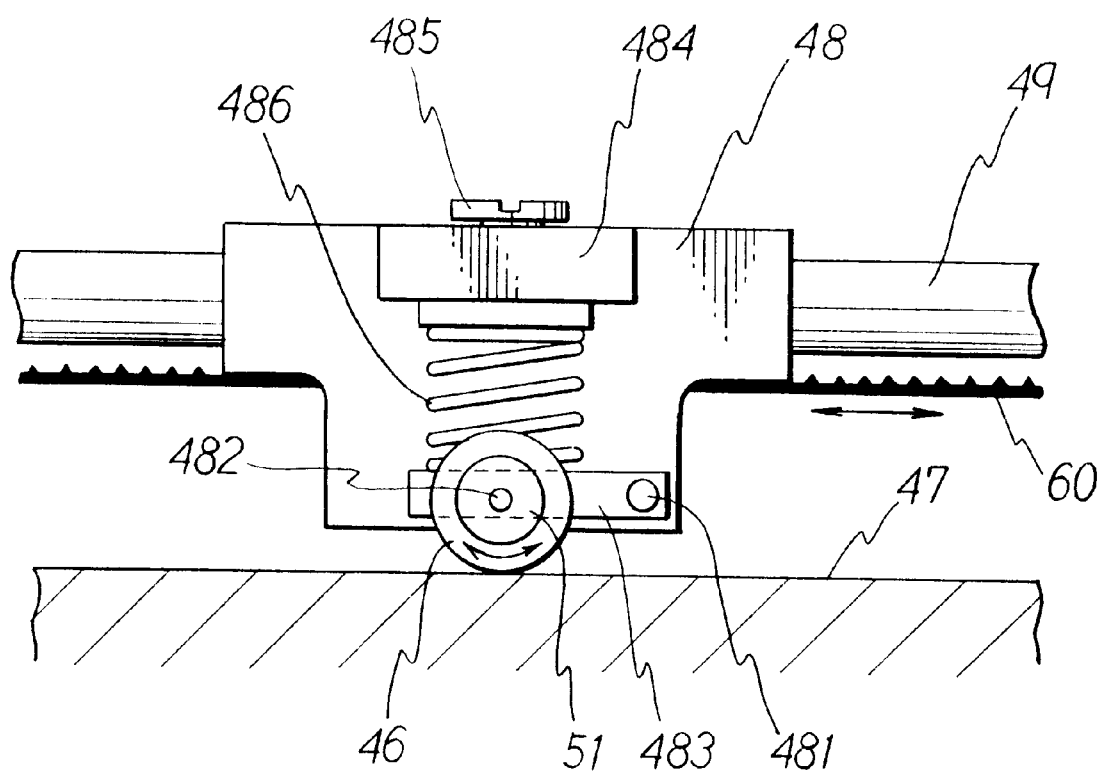
FIG. 21 is a structural view of a developing device for developing a microcapsule coated sheet under pressure in accordance with the embodiment 2 of the invention.

A development step for the microcapsule coated sheet is described with reference to FIGS. 11 and 21. FIG. 21 shows an embodiment of a developing device 45 for developing a microcapsule coated sheet 37. For simplification, the microcapsule coated sheet 37 that has been exposed is not shown.

The developing device 45 as a pressure developing apparatus achieves development by elastically pressing the surface of the microcapsule coated sheet 37 in a point contact manner. This device 45 pressure develops only the development areas by pressing a point contact roller 46 against the microcapsule coated sheet 37 while changing the position of pressing. To change this position of pressing, it is recommendable to move the point contact roller 46 monoaxially in a reciprocating manner parallel to the microcapsule coated sheet 37, while moving the microcapsule coated sheet 37 in a direction orthogonal to the direction of movement of the point contact roller 46. This is useful for downsizing the apparatus.

At the point of pressing by the point contact roller 46, the microcapsules are destroyed by a low pressing force for development under pressure. The material enveloped therein (the colorless dye precursor) drains, causing a color development reaction with the developer. Then, the relative movement of the point contact roller 46 and the microcapsule coated sheet 37 results in the visualization of a color image in the development areas.

In the embodiment shown in FIG. 21, the microcapsule coated sheet 37 to be pressure developed is fed to a nearly flat base 47. This base 47 may be shaped like a roller rather than a flat surface so as to feed the microcapsule coated sheet 37.

At least one point contact roller 46 is disposed to elastically press and engage the microcapsule coated sheet 37, and this point contact moves back and forth in a constant range on the base 47 that corresponds to the microcapsule coated sheet 37. A carriage 48 is supported so as to be free to reciprocate parallel to the surface of the base 47 and along a guide shaft 49 orthogonal to the direction of feeding of the microcapsule coated sheet 37. On that side surface of the carriage 48 which lies on the microcapsule coated sheet discharge side, an arm support shaft 481 protrudes in a plane parallel to the upper end surface of the base 47 and in a direction orthogonal to the guide shaft 49. One end of an arm 483 is supported rotatably on the arm support shaft 481.

At the other end of the arm 483, a bearing support shaft 482 protrudes which extends parallel to the arm support shaft 481. To the bearing support shaft 482, an inner ring of a bearing 51 such as ball bearing is attached.

The point contact roller 46 is shaped like a ring, and formed such that its cross-sectional shape perpendicularly intersecting its central axis of rotation is circular, and its cross-sectional diameter is the largest at the central part, and the farther from the central part, the smaller its cross-sectional diameter gradually becomes. That is, the peripheral surface of the roller assumes a curved surface convex at the center. The inner peripheral surface of this point contact roller 46 is pressed into and fixed to the outer peripheral surface of the bearing 51. Thus, the point contact roller 46 is free to rotate about an axis parallel to the direction of feeding of the microcapsule coated sheet 37.

At the carriage 48, a stepped portion 484 is formed to protrude so as to look down at the arm 483. An adjusting screw 485 is screwed into the stepped portion 484 for making it possible to adjust upward and downward movement along a direction orthogonal to the upper end surface of the base 47. Between a front end part of the adjusting screw 485 and the upper end surface of the arm 483, a compression spring 486 is interposed. Thus, the point contact roller 46 is urged to the upper end surface of the base 47 by the urging force of the compression spring 486. The urging force of the compression spring 486 also urges the carriage 48 counterclockwise in FIG. 11, but the turn of the carriage 48 is restrained because of the contact of the receiving roller 482 with the receiving shaft 491. By turning the adjusting screw 485 to move it forward or backward, the urging force (pressure load) of the compression spring 486 can be adjusted arbitrarily.

The force of urging the point contact roller 46 against the microcapsule coated sheet 37 may be produced by using a pneumatic device, a hydraulic device or a solenoid instead of the compression spring 486. That is, an electromagnetic force may be used besides an elastic body. In short, any urging means between the point contact roller and the base side (the microcapsule coated sheet side) may be employed.

To the carriage 48, a timing belt 60 is fixed. The timing belt 60 is rotated in a reciprocating manner by the carriage drive motor 62. By this normal and reverse rotational movement of the timing belt 60, the carriage 48 is moved in a reciprocating manner parallel to the base 47. This reciprocating movement sequentially shifts the point of pressing by the point contact roller 46.

The carriage drive motor 62 can control the direction and amount of rotation, and can use an open loop control type pulse motor. In addition to the pulse motor, an ordinary DC/AC motor may be used.

The carriage 48 is moved along the guide shaft 49 to pressure develop one line. Once this pressure development is completed, the feeding roller 68 is rotated by one line or an integral multiple of one line to feed a constant amount of the microcapsule coated sheet 37. The carriage 48 is moved again to carry out pressure development of one line. This action is repeated until the pressure development of all development areas is completed.

Figure 22:
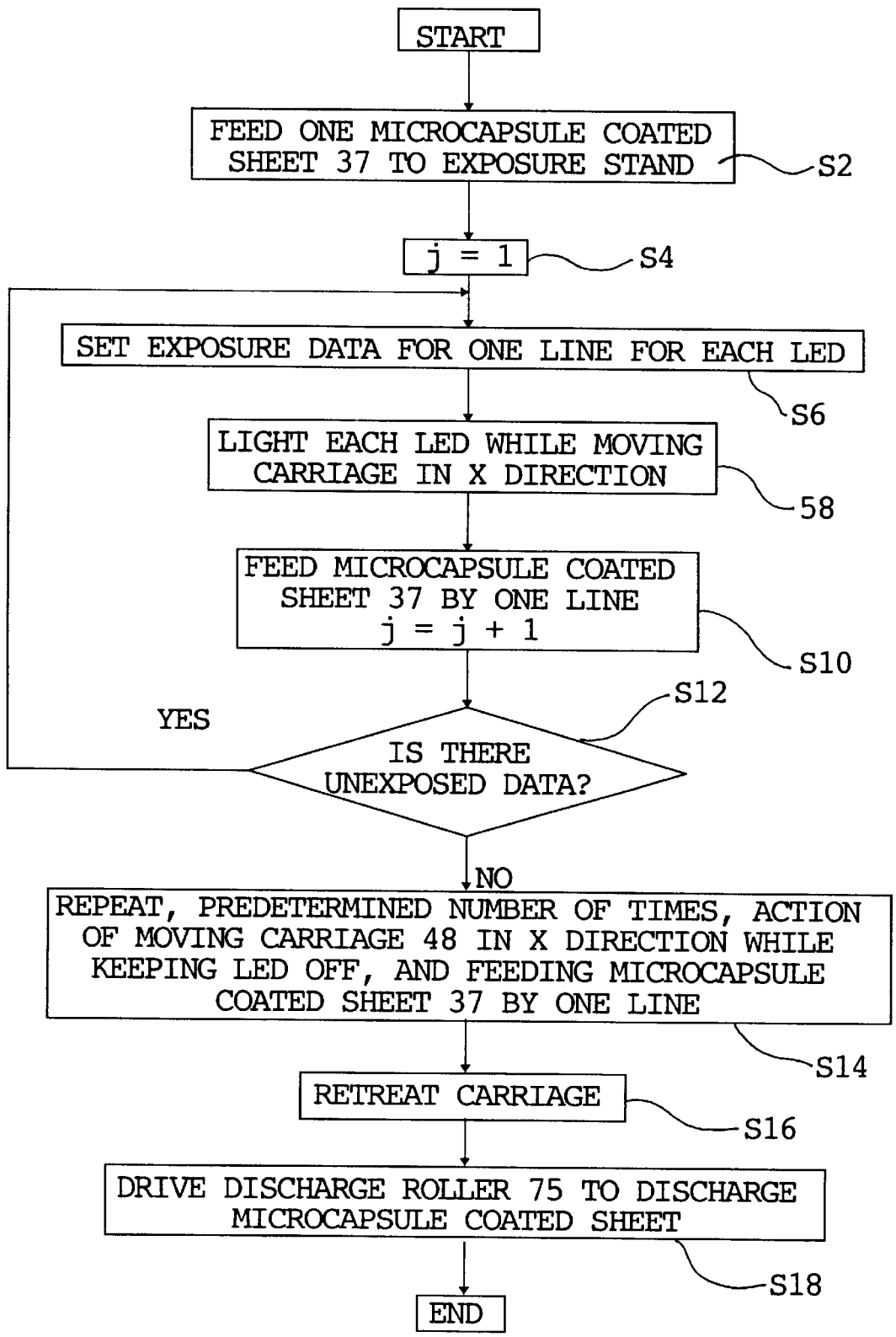
FIG. 22 is a flow chart showing the main actions of a CPU of the photosensitive, pressure-sensitive printer in accordance with the embodiment 2 of the invention.
Figure 23:
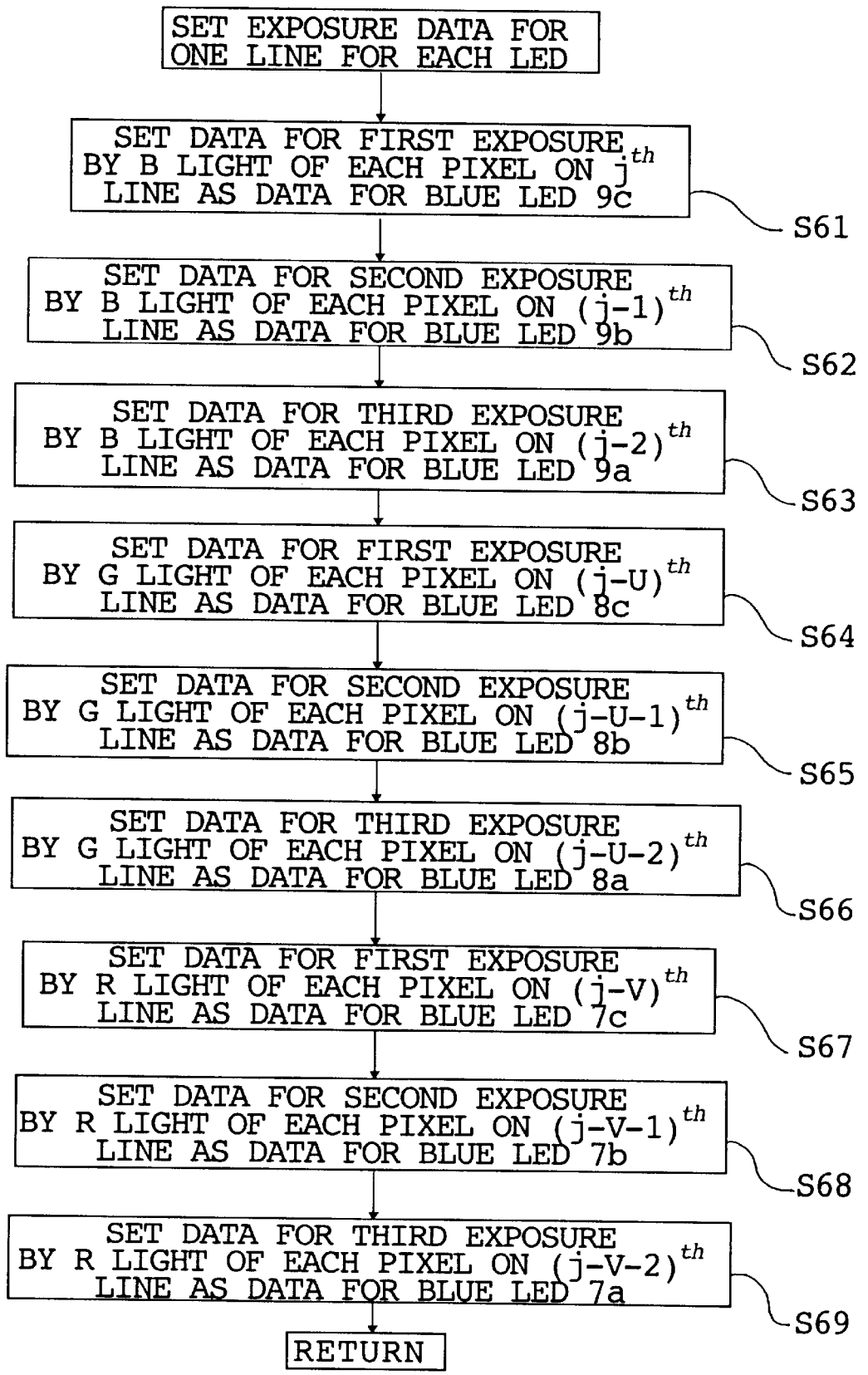
FIG. 23 is a flow chart showing the setting of exposure data for one line among the main actions of the CPU.

The actions of the printer 800 in accordance with the instant embodiment will be described with reference to flow charts of FIGS. 22 and 23.

First, the user mounts the cassette 67 into the printer body, and turns on the power switch. An electric current is passed through the heaters 64a, 64b to bring them to predetermined temperatures.

Then, image data on an image to be produced and a print start command signal are entered from the host computer connected to the printer. Image data is supplied as a two-dimensional bit map type of data, and information showing the densities of the respective R, G and B components of the pixels is also included in the image data. The entered image data is stored in the RAM.

Responsive to the print start command signal, the CPU 70 rotates the semilunar roller 65 and the feeding roller 68 to draw out one microcapsule coated sheet 37 from the cassette 67 and move it onto the exposure stand 66 (S2). At this time, the front end of the sheet is situated on the moving locus of the blue LED 9*d* on the exposure head 200.

Then, a line counter j is initialized (S4), and exposure data (drive data) for one exposure line for the respective LED's is set (S6). This setting is performed as shown in the flow chart of FIG. 22. The first step is to compute drive data for the LED's during exposure when exposing each pixel once or a plurality of times (maximum 3 times in the instant embodiment) on the basis of color density information on different color components of the respective pixels of image data entered. That is, the drive time and luminous intensity of the LED's at each exposure are set so that a maximum of 3 exposures will be performed for one pixel. In detail, the total quantity of exposure energy has been associated with the desired image density, and stored in the table of the ROM 71. Thus, the total exposure energy for each color is calculated based on the density information on each color of the particular pixel. A third of the determined total exposure energy is the exposure energy per exposure. If this value does not satisfy the predetermined standard value, however, two or less exposures are to be performed, and exposure energy for each exposure is computed.

The drive time and luminous intensity of the LED's adapted to the obtained values of exposure energy have been stored as a table in the ROM 71. With reference to this table, LED drive data for each exposure when exposing the different color components of the particular pixel once or a plurality of times (a maximum of 3 times) is found, and sequentially stored in the RAM 72. In short, LED drive data for three exposures are computed based on the entered image data.

After this computation, drive data for the first exposure by B light of each pixel on the jth line of image represented by image data is set (stored) in the line memory as drive data for the blue LED 9*c* (S61). Then, drive data for the second exposure by B light of each pixel on the (j-1)th line is set in the line memory as drive data for the blue LED 9*b* (S62). Then, drive data for the third exposure by B light of each pixel on the (j-2)th line is set in the line memory as drive data for the blue LED 9*a* (S63).

Then, drive data for the first exposure by G light of each pixel on the (j-U)th line is set in the line memory as drive data for the green LED 8*c* (S64). The constant U used here is the value 12 in the case of this embodiment. This is because the distance between the blue LED 9*c* and the green LED 8*c* corresponds to 12 exposure lines (dots), and the timing of exposure is delayed that much. Then, drive data for the second exposure by G light of each pixel on the (j-U-1)th line is set in the line memory as drive data for the green LED 8*b* (S65). Next, drive data for the third exposure by G light of each pixel on the (j-U-2)th line is set in the line memory as drive data for the green LED 8*a* (S66).

Further, drive data for the first exposure by R light of each pixel on the (j-V)th line is set in the line memory as drive data for the red LED 7*c* (S67). Here, the constant V is the value 24 in the case of this embodiment. This is because the distance between the blue LED 9*c* and the red LED 7*c* corresponds to 24 exposure lines (dots), and the timing of exposure is delayed that much.

Furthermore, drive data for the second exposure by R light of each pixel on the (j-V-1)th line is set in the line memory as drive data for the red LED 7*b* (S68). Next, drive data for the third exposure by R light of each pixel on the (j-V-2)th line is set in the line memory as drive data for the red LED 7*a* (S69). Then, this processing routine is exited.

Subsequently, the CPU 70 moves the carriage 48 in the X direction from the stop position outside the image forming areas of the microcapsule coated sheet 37. During this motion, the CPU 70 drives the respective LED's on the basis of drive data set by the processing routine (S6). At this time, data are sequentially read, starting with drive data on the LED corresponding to the pixel at one end of each exposure line, toward the pixel at the other end, whereby the LED's are driven. The moving position of the carriage 48 in the X direction is grasped based on the amount of drive of the carriage feed motor 62. To expose the pixel present at a place where the pinhole 12 of the exposure head is located, the corresponding drive data is sequentially read. As shown in FIG. 16, the positions of the LED's on each exposure line are displaced from each other by 16 dots. Thus, delays corresponding to 16 dots and 32 dots are present at the second exposure and the third exposure. On this occasion, output light from each LED is isolated from that from one another LED by the separating wall 222 in the instant embodiment. Hence, light ejected through the pinhole 12 does not incorporate light of an undesirable color, so that an exposed latent image can be formed faithfully based on image data.

During movement of the carriage 48 for exposure, the blue LED 9*d* and the green LED 8*d* are constantly lit to perform auxiliary exposure to B light and G light.

After exposure of one line is completed, the carriage 48 is stopped at the side reverse to the side at which its movement started. At this time, the CPU 70 rotates the feeding roller 68 to feed the microcapsule coated sheet 37 by one line and increment the line counter j (S10).

Then, the CPU 70 determines whether exposure is completed or not (S12). If exposure is not completed (S12; YES), the processing step S6 is resumed, and a next exposure is performed. For instance, when the first exposure is performed by the blue LED 9*c* immediately previously for the pixels on the first line, the first exposure is performed by the blue LED 9*c* for the pixels on the second line, and the second exposure is performed by the blue LED 9*b* for the pixels on the first line. Then, for the pixels on the third line, the first exposure is performed by the blue LED 9*c*; for the pixels on the second line, the second exposure is performed by the blue LED 9*b*; and for the pixels on the first line, the final third exposure is performed by the blue LED 9*a*. In this manner, the microcapsule coated sheet 37 is exposed, while being fed sequentially, by the LED's for image modulation and the LED's for auxiliary exposure. As a result, the microcapsule coated sheet 37 is interposed between the point contact roller 46 and the base 47, whereby the exposed capsules are simultaneously pressure developed.

Exposure and pressure development are simultaneously carried out in the above-described manner. Upon completion of exposure, Step S12 give the answer No. The CPU 70 repeatedly applies pressure development to all of the latent image information areas that have not been pressure developed (S14). That is, the action of moving the carriage 48 with the LED's turned off, and feeding the microcapsule coated sheet 37 by one line is repeated a predetermined number of times. Then, the carriage 48 is retreated sideways of the microcapsule coated sheet path (S16). The discharge roller 75 is driven to discharge the developed microcapsule coated sheet to the outside of the machine. In this manner, a full-color image of high image quality can be formed, and the microcapsule coated sheet itself can be stored. The exposed microcapsule coated sheet has a visible image sandwiched between two sheet (one sheet is transparent). Thus, it is not damaged during handling, has high environmental resistance, withstands long-term storage, and is satisfactory in appearance.

The photosensitive pressure sensitive printer as the image forming machine of the present invention, described in detail above, is not restricted to the Embodiments 1 and 2, but may be changed variously.

Figure 24:
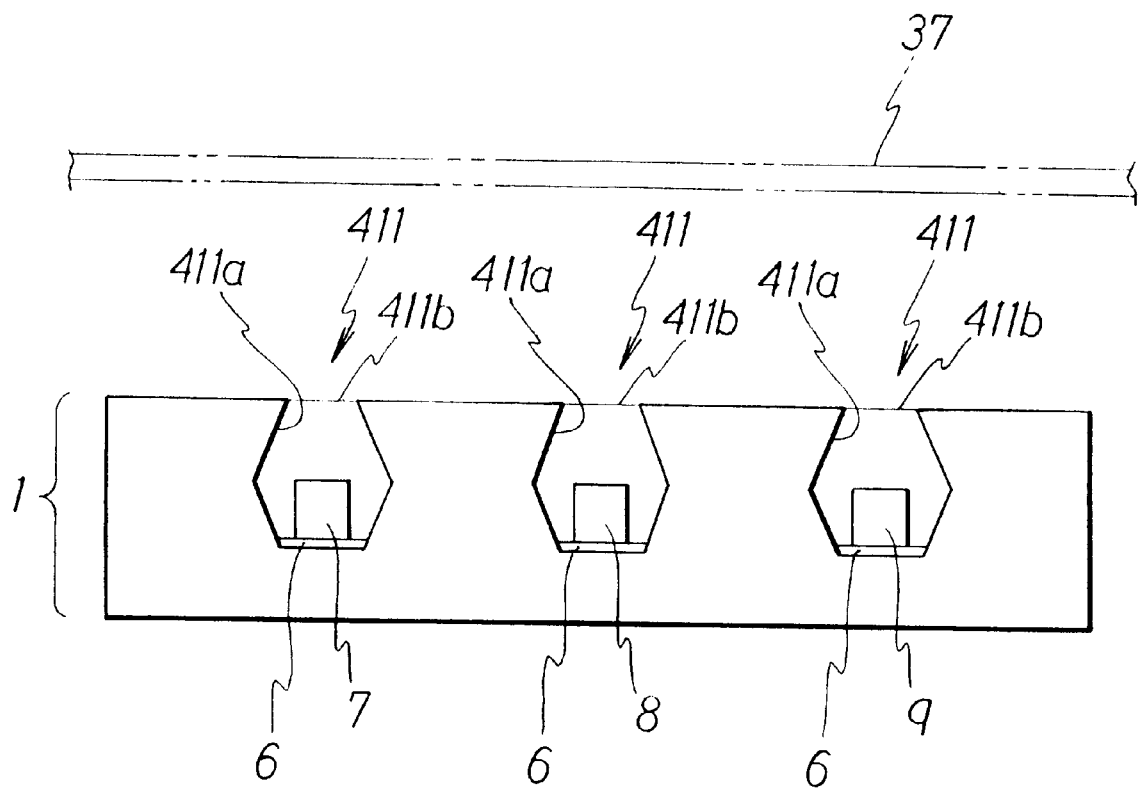
FIG. 24 is a schematic sectional view of an exposure head in accordance with another embodiment of the invention.

The structure of the exposure unit is not restricted to those shown in FIGS. 1, 10, and 14, but a structure as shown in FIG. 24 may be acceptable. In this exposure unit 210 shown in FIG. 24, a substrate 1' has recesses 411 formed in the surface thereof. The light emitting elements such as LEDs 7,8,9 are accommodated in the recesses 411, which have heagonal shapes in cross section. The light emmiting elements 7–9 are disposed on the bottoms of the recesses 411 via conductive adhesive 6. The opening 411a of each of the recesses are restricted so as to function of a stop of a light beam from each of the light emitting elements 7–9. Namely, the openings 411a have the same function as the openings of the mask shown in FIGS. 1, 10 and 14. The inner surfaces 411b of the recesses have reflecting properties. Thus, a beam from each of the light emitting elements 7–9 and a light beam indirectly from each of the light emitting elements 7–9 through reflection with the inner surfaces 411b of the recesses are restricted by the stop and be directed to a portion of the surface of the microcapsule coated sheet 37, which is opposed to the each of the light emitting elements. The shapes of the recesses 411 in the cross section is not limited to the hexagon, but any other shapes, such as a round shape, an oval shape can be accepted. It is preferable that the recesses 411 have such shapes that reflected lights from the light emitting elements 7–9 are directed through the openings in a direction perpendicular to the surface of the substrate 1'. This structure of the exposure unit 210 shown in FIG. 24 is simpler than those shown in FIGS. 1, 10 and 14, since this exposure unit 210 does not need the mask.

The photosensitive recording medium is not restricted to the above-mentioned microcapsule coated sheet, but various modifications are acceptable. As the microcapsule coated sheet, not only the aforementioned autocoupling or spontaneous color development type, but the transfer type can be used. For instance, a transparent substrate sheet bearing microcapsules, and an image-receiving sheet bearing a developer are strippably integrated such that the microcapsule surface of the substrate sheet and the developer surface of the image receiving sheet are brought face to face. The resulting integral sheet is fed from the cartridge with the substrate sheet being located on the exposure head side. Then, the integral sheet is exposed, developed, and discharged to the outside of the machine, whereafter the image receiving sheet may be stripped. The principle with this type of sheet is that the dye precursor as the coloring material, draining from the microcapsules destroyed under pressure, is transferred to the developer of the image receiving sheet, whereupon a color development reaction occurs to produce a visible image.

Instead of the dye precursor, a precolored pigment or dye may be enveloped in microcapsules together with a photosensitive material. In this case, a developer-free image receiving paper (plain paper) is integrated strippably with a substrate sheet, whereby transfer type image formation is rendered possible. By stripping the image receiving paper, an image is visualized thereon.

In addition to the microcapsule coated sheet, silver salt films, diazotype papers, and any other photosensitive recording media may be used which are exposed to light and subjected to a development operation to show colors. The image forming machine using such a photosensitive recording medium gives the effects of the present invention.

In the Embodiments 1 and 2, a point contact ball, or a pressure roller making a linear contact may be employed in addition to the point contact roller 46. Any other embodiment capable of pressure rupturing the microcapsules is usable.

The light emitting element is not limited to an LED. Various structures, such as EL light emitting element, plasma light emitting element, and laser light emitting element, may be applied.

The radiations from the light emitting elements need not be composed of red, blue and green radiations. In agreement with the sensitivity characteristics of the photosensitive recording medium, radiations of various wavelengths can be selected. For example, a combination of infrared light, red light and green light can be selected. Far-infrared light, near-infrared light, and red light can be combined. Alternatively, ultraviolet radiation and far-ultraviolet radiation are one of effective options for colors of the light emitting element.

The number of the colors for the light emitting elements is not limited to three, red, green and blue. One color or two colors are acceptable. Four or more colors as in an ordinary color printer using yellow, magenta, cyan and black as color developing agents can also be selected.

As detailed above, the image forming machine of the present invention possesses the effect that the efficiency of optical utilization can be increased, because not only direct light, but also part of light reflected by the surface of the recess in the substrate passes through the mask opening as output light from the light emitting element, and reaches the photosensitive recording medium. Consequently, the image forming machine can be provided even by the use of light emitting elements of lower output. Furthermore, because of the reflection at the surface of the recess, output light does not directly fall on the adjacent light emitting element. This brings the effect that the quality of an output image formed by the image forming machine is not deteriorated by stray light.

According to the exposure apparatus and image forming machine of the present invention, the separating wall separates the optical propagation space between the substrate of the exposure head and the mask into individual chambers so that output radiations from a plurality of light emitting elements disposed on the substrate do not intersect each other to propagate to the openings. Thus, the radiations from the respective light emitting elements do not mingle with each other, so that untoward background light not corresponding to the image does not exit from the mask holes. Hence, stray light-associated deteriorations in color reproduction, lightness reproduction, and resolution of the image can be prevented, and the quality of the resulting output image can be improved.

Furthermore, the exposure apparatus and image forming machine of the present invention not only position and hold the light emitting elements, and the mask having the corresponding openings, but also possess the separating wall. Thus, stray light can be suppressed, and satisfactory image quality attained, using a simple structure.

What is claimed is:

1. An exposure apparatus for exposing a photosensitive medium, comprising;
   a plurality of light emitting elements;
   a substrate having recesses formed in a surface thereof, said plurality of light emitting elements being disposed in the recesses; and a mask having openings formed opposite the light emitting elements; wherein each of the recesses has a reflecting surface for reflecting light emitted from one of said plurality of light emitting elements disposed therein to an opening formed in the mask and wherein the photosensitive medium is exposed to the light emitted through the openings.

2. The exposure apparatus of claim 1, wherein at least one of the recesses formed in the surface of the substrate has reflecting properties, and the recess has such a shape that reflected light from the recess is ejected through the opening provided opposite the relevant light emitting element.

3. The exposure apparatus of claim 1, wherein at least one of the recesses has a shape which prevents light from the light emitting element disposed in the recess from exiting through an opening opposed to the adjacent light emitting element.

4. The exposure apparatus of claim 1, wherein an optical element is provided in or above the opening.

5. The exposure apparatus of claim 1, wherein a separating wall for preventing light from a first light emitting element from exiting through an opening opposed to a second light emitting element adjacent to the first emitting element is provided between the first and second light emitting elements.

6. The exposure apparatus of claim 5, wherein the mask is supported on the substrate by the separating wall.

7. The exposure apparatus of claim 5, wherein at least one of the recesses in the surface of the substrate has reflecting properties.

8. The exposure apparatus of claim 5, wherein at least one of the recesses in the surface of the substrate has reflecting properties, and the recess has such a shape that reflected light from the recess is ejected through the opening provided opposite the relevant light emitting element.

9. The exposure apparatus of claim 5, wherein at least one of the recesses has a shape which prevents light from the light emitting element disposed in the recess from exiting through an opening opposed to an adjacent light emitting element.

10. The exposure apparatus of claim 5, wherein an optical element is provided in or above the opening.

11. The exposure apparatus of claim 1, wherein the substrate is composed of an electrically conductive material.

12. The exposure apparatus of claim 1, wherein the substrate is composed of a reflective material.

13. The exposure apparatus of claim 1, wherein the photosensitive medium is a medium which bears microcapsules enveloping a component varying in strength upon exposure, and a coloring material, and in which development is performed by draining of the coloring material when the microcapsules are ruptured under pressure.

14. The exposure apparatus of claim 1, wherein the light emitting elements are LED's, and the LED's are connected to areas other than the recesses on the substrate by at least one electrical connection.

15. The exposure apparatus of claim 1, wherein the plurality of light emitting elements are light emitting elements which emit light of different wavelengths from those of one another.

16. The exposure apparatus of claim 15, wherein the plurality of light emitting elements include three light emitting elements which emit lights with central wavelengths for red, green and blue, respectively.

17. The exposure apparatus of claim 1, wherein the openings are pinholes.

18. The exposure apparatus of claim 1, wherein a surface of the mask which is opposed to the substrate has been subjected to reflection-free treatment.

19. The exposure apparatus of claim 1, wherein the substrate and the mask are molded integrally.

20. The exposure apparatus of claim 1, wherein light emitted from a side surface of each of the plurality of light emitting elements is reflected by the reflecting surface of the recess in which the light emitting element is disposed, through the opening formed in the mask.

21. An image forming machine for a photosensitive recording medium on whose surface a latent image of image information is formed by exposure and converted into a visible image by development, said image forming machine comprising:

an exposure unit including a plurality of light emitting elements, a substrate having recesses formed in a surface thereof, said plurality of light emitting elements being disposed in the recesses, and a mask having openings formed opposite the plurality of light emitting elements; and a development unit, wherein each of the recesses has a reflecting surface for reflecting light emitted from one of said plurality of light emitting elements disposed therein to an opening formed in the mask.

22. The image forming machine of claim 21, wherein the photosensitive medium is a medium which bears microcapsules enveloping a component varying in strength upon exposure, and a coloring material, and in which development is performed by draining of the coloring material when the microcapsules are ruptured under pressure, and the development unit is a pressure developing device which presses the microcapsules.

23. The image forming machine of claim 22, including a carriage movable relative to the photosensitive recording medium, and having both the exposure unit and the development unit; and an apparatus for moving the carriage relative to the photosensitive recording medium.

24. The image forming machine of claim 23, wherein the apparatus for moving the carriage relative to the photosensitive recording medium is composed of a medium feeding device for feeding the photosensitive recording medium, and a carriage feeding device for conveying the carriage in a direction intersecting the direction of feeding of the medium feeding device.

25. The image forming machine of claim 23, including a control circuit for controlling the exposure unit and the apparatus for moving the carriage relative to the photosensitive recording medium so as to light the light emitting elements in accordance with the moving position of the carriage on the basis of image data.

26. The image forming machine of claim 22, wherein the pressure developing device includes a contact unit which contacts the photosensitive recording medium placed on a bearing surface, and the contact unit has an urging member for urging the photosensitive recording medium so as to be compressed against the bearing surface.

27. The image forming machine of claim 26, wherein the contact unit is a rotatably supported ball.

28. The image forming machine of claim 21, wherein at least one of the recesses formed in the surface of the substrate has reflecting properties, and the recess has such a shape that reflected light from the recess is ejected through the opening provided opposite the relevant light emitting element.

29. The image forming machine of claim 21, wherein at least one of the recesses has a shape which prevents light from the light emitting element disposed in the recess from exiting through an opening opposed to an adjacent light emitting element.

30. The image forming machine of claim 21, wherein an optical element is provided in or above the opening.

31. The image forming machine of claim 21, wherein a separating wall for preventing light from a first light emitting element from exiting through an opening opposed to a second light emitting element adjacent to the first light emitting element is provided between the first and second light emitting elements.

32. The image forming machine of claim 31, wherein the mask is supported on the substrate by the separating wall.

33. The image forming machine of claim 31, wherein at least one of the recesses formed in the surface of the substrate has reflecting properties.

34. The image forming machine of claim 31, wherein at least one of the recesses formed in the surface of the substrate has reflecting properties, and the recess has such a shape that reflected light from the recess is ejected through the opening provided opposite the relevant light emitting element.

35. The image forming machine of claim 31, wherein at least one of the recesses has a shape which prevents light from the light emitting element disposed in the recess from exiting through an opening opposed to an adjacent light emitting element.

36. The image forming machine of claim 31, wherein an optical element is provided in or above the opening.

37. The image forming machine of claim 21, wherein the substrate is composed of an electrically conductive material.

38. The image forming machine of claim 21, wherein the substrate is composed of a reflective material.

39. The image forming machine of claim 21, wherein the light emitting elements are LED's, and the LED's are connected to areas other than the recesses on the substrate by at least one electrical connection.

40. The image forming machine of claim 39, wherein the plurality of light emitting elements include three light emitting elements which emit lights with central wavelengths for red, green and blue, respectively.

41. The image forming machine of claim 21, wherein the plurality of light emitting elements are light emitting elements which emit light of different wavelengths from those of one another.

42. The image forming machine of claim 21, wherein the openings are pinholes.

43. The image forming machine of claim 21, wherein a surface of the mask which is opposed to the substrate has been subjected to reflection-free treatment.

44. The image forming machine of claim 21, wherein the recesses are plated.

45. The image forming machine of claim 21, wherein a sealing material is filled into the gap between the substrate and the mask.

46. The image forming machine of claim 21, wherein the openings opposed to the light emitting elements include openings composed of a pinhole for image modulating exposure and a pinhole for auxiliary exposure.

47. The image forming machine of claim 21, wherein light emitted from a side surface of each of the plurality of light emitting elements is reflected by the reflecting surface of the recess in which the light emitting element is disposed, through the opening formed in the mask.

48. An exposure apparatus for exposing a photosensitive medium, comprising;

a plurality of light emitting elements;

a substrate having recesses which are formed in a surface thereof and in which said plurality of light emitting elements are accommodated; and an opening formed in a mask for each of the recesses being restricted as to function as a stop for a light beam from each of the light emitting elements, wherein each of the recesses has a reflecting surface for reflecting light emitted from a light emitting element accommodated therein to an opening.

49. An exposure apparatus for exposing a photosensitive medium of claim 48, wherein the light beam from each of the light emitting elements is restricted by the stop and is directed to a portion, which is opposed to the each of the light emitting elements, of the surface of the photosensitive medium.

50. The exposure apparatus of claim 49, wherein an optical element is provided in or above each of the openings.

51. An exposure apparatus for exposing a photosensitive medium of claim 48, wherein the light beam from each of the light emitting elements and a light beam indirectly from each of the light emitting elements through reflection with the surface of the recess having the reflecting properties are restricted by the stop and is directed to a portion, which is opposed to the each of the light emitting elements, of the surface of the photosensitive medium.

52. The exposure apparatus of claim 48, wherein light emitted from a side surface of each of the plurality of light emitting elements is reflected by the reflecting surface of the recess in which the light emitting element is accomodated, through the opening formed in the mask.

* * * * *